(12) United States Patent
Yamasaki et al.

(10) Patent No.: US 6,399,484 B1
(45) Date of Patent: Jun. 4, 2002

(54) SEMICONDUCTOR DEVICE FABRICATING METHOD AND SYSTEM FOR CARRYING OUT THE SAME

(75) Inventors: Hideaki Yamasaki, Nirasaki; Satoshi Yonezawa, Takanezawa-machi; Susumu Arima, Yamanashi-ken; Yumiko Kawano, Kofu; Mitsuhiro Tachibana, Yamanashi-ken; Keizo Hosoda, Nirasaki, all of (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 09/425,971

(22) Filed: Oct. 25, 1999

(30) Foreign Application Priority Data

Oct. 26, 1998 (JP) .............................................. 10-321267
Nov. 4, 1998 (JP) .............................................. 10-328865
Aug. 24, 1999 (JP) .............................................. 11-236687

(51) Int. Cl.⁷ ..................... H01L 21/4763; H01L 21/44; H01L 21/302
(52) U.S. Cl. .................. 438/648; 438/627; 438/643; 438/653; 438/656; 438/660; 438/685; 438/775
(58) Field of Search ........................... 438/648, 627, 438/656, 643, 660, 653, 663, 644, 685, 654, 680, 770, 772–777, 798

(56) References Cited

U.S. PATENT DOCUMENTS

| | | | | |
|---|---|---|---|---|
| 5,391,394 A | * | 2/1995 | Hansen | 427/124 |
| 5,633,200 A | * | 5/1997 | Hu | 438/653 |
| 5,670,808 A | * | 9/1997 | Nishihori et al. | 257/310 |
| 5,691,235 A | * | 11/1997 | Meikle et al. | 438/680 |
| 5,709,757 A | * | 1/1998 | Hatano et al. | 134/22.14 |
| 5,913,144 A | * | 6/1999 | Nguyen et al. | 438/643 |
| 6,037,263 A | * | 3/2000 | Chang | 438/712 |
| 6,162,715 A | * | 12/2000 | Mak et al. | 438/592 |
| 6,218,288 B1 | * | 4/2001 | Li et al. | 438/627 |

FOREIGN PATENT DOCUMENTS

| | | |
|---|---|---|
| JP | 8-325736 | 12/1996 |
| TW | 85113959 | 2/1999 |

* cited by examiner

*Primary Examiner*—Ha Tran Nguyen
(74) *Attorney, Agent, or Firm*—Smith Gambrell & Russell, LLP

(57) ABSTRACT

A semiconductor device fabricating method includes a preparatory process that brings a first source gas containing tungsten atoms into contact with a workpiece and that does not bring a second source gas containing nitrogen atoms into contact with the workpiece, and a film forming process that forms a tungsten nitride film on the workpiece by using the first and the second source gases so as to fabricate a semiconductor device. The semiconductor device fabricating method is capable of preventing the tungsten nitride film from peeling off from a layer underlying the same when the tungsten nitride film is subjected to heat treatment.

4 Claims, 7 Drawing Sheets

EFFECT OF NH3 GAS FLOW RATE

EFFECT OF NH3/WF6 FLOW RATE RATIO

EFFECT OF PRESSURE (NH$_3$/WF$_6$ = 0.5)

EFFECT OF PRESSURE (NH$_3$/WF$_6$ = 500)

EFFECT OF NH₃ GAS FLOW RATE

EFFECT OF PRESSURE

EFFECT OF Ar AND N₂ GAS FLOW RATE

SEMICONDUCTOR DEVICE FABRICATING METHOD AND SYSTEM FOR CARRYING OUT THE SAME

BACKGROUND OF THE INVENTION

1. Field of the Invention

The present invention relates to a semiconductor device fabricating method and a semiconductor device fabricating system. More specifically, the present invention relates to a semiconductor device fabricating method that forms a tungsten nitride film ($WN_x$ film) for using as wiring lines, a barrier-metal or electrodes, and a system for carrying out the same.

2. Description of the Related Art

The resistance of gates of semiconductor devices, such as field-effect transistors, increases with the miniaturization of the semiconductor devices. Therefore, desired is materials for forming wiring lines and electrodes, capable of forming a gate having a low resistance even if the gate is miniaturized. Known conductive polysilicon films (poly-Si films) have been replaced in recent years with metal silicide films having a high melting point, such as tungsten silicide films. Recently, tungsten films have been believed to be promising because tungsten films are capable of forming gates having a resistance lower by one figure than that or gates formed from tungsten silicide films.

A laminated film including a tungsten film for forming electrodes is formed by laminating a gate oxide film, a poly-Si film and a tungsten film. If the tungsten film is laminated directly to the poly-Si film, portions of the poly-Si film and the tungsten film facing the interface between the poly-Si film and the tungsten film interact and produce tungsten silicide (WSi) when the laminated film is subjected to a heat treatment process (850 to 900° C.) The tungsten silicide ($WS_1$) produced in the interface increases the resistance of the electrode formed from the laminated film. If active reaction between the poly-Si film and the tungsten film takes place in the interface, the tungsten forming the tungsten film will further diffuse through the gate oxide film into a silicon wafer supporting the laminated film, which may increase leakage current that leaks from the transistor or reduce breakdown voltage.

When using a tungsten film for forming an electrode, it is general to prevent interaction between tungsten and poly-Si by sandwiching a barrier film, i.e., a metal nitride film having a high melting point, such as a tungsten nitride film or titanium nitride film, between the tungsten film and the poly-Si film. The tungsten nitride film is stable at rather high temperatures and can be formed of crystal grains of a crystal structure other than a columnar structure. And also large tungsten crystal grains can be grown on the tungsten nitride film to form a tungsten film having a low resistivity. However, the titanium nitride film can be formed of crystal grains only of a columnar structure, and tungsten film to be formed over this titanium nitride film has only limited grain sizes.

Incidentally, the following are known methods for forming tungsten nitride films, i.e., preferable gate barrier films.

(1) Thermal CVD method using $WF_6$ gas (tungsten hexafluoride gas) and $NH_3$ gas (ammonia gas)

(2) Plasma CVD method using $WF_6$ gas and $NH_3$ gas, such as disclosed in JP-A No. 50515/1989

(3) Plasma CVD method using $WF_6$ gas, $N_2$ gas and $H_2$ gas, such as disclosed in JP-A No. 50515/1989

(4) Plasma CVD method using $WF_6$ gas and $NF_3$ gas (nitrogen trifluoride gas) (Suzuki, et al., "Advanced Metalization and Interconnect Systems for ULSI Application in 1997", Mter. Res. Soc., 1998, 49)

(5) Thermal CVD method using organic tungsten source (Sun, et al., Proc. of $13^{th}$ VMIC, 151, 1996)

SUMMARY OF THE INVENTION

The thermal CVD method of (5) needs a high film forming temperature exceeding 600° C. and the diffused layer of a transistor may possibly be damaged at such a high film forming temperature. The film forming methods of (1) to (4) use film forming temperatures in the range of 450 to 500° C. and hence do not encounter any problem like that encountered by the film forming method of (5).

The film forming methods of (2) to (4) using a plasma are easy to give damage to the gate oxide and have poor step coverage of via holes or the like, and need an expensive film forming system.

The film forming method of (1) is a thermal CVD method that does not need any plasma and hence does not encounter any problem like that encountered by the plasma CVD methods of (2) to (4). However, the tungsten nitride film formed by the thermal CVD method of (1), as compared with the tungsten nitride film formed by the plasma CVD method, has a relatively high resistivity. There is a further problem that, when a tungsten film is formed over a tungsten nitride film by a thermal CVD method, and the tungsten film and the tungsten nitride film underlying the former are heat-treated at a temperature in the range of 800 to 900° C. for 60 s, the tungsten film peels from the tungsten nitride film.

As a result, the thermal CVD method of (1) using $WF_6$ gas and $NH_3$ gas is preferable for the method of forming tungsten nitride films. However, in the method of (1), the tungsten film is liable to peel at the heat-treatment step after forming the tungsten nitride film. And also the tungsten nitride film has a relatively high resistivity.

Sometimes, a tungsten nitride film formed by a prior film forming method contains fluorine in a high content. The fluorine contained in the tungsten nitride film affects adversely the reliability of a semiconductor device fabricated by using the tungsten nitride film. Accordingly, it is desired to determine film forming conditions that should reduce the fluorine content of the film.

In most cases, holes are formed in a surface on which a film is to be deposited. When forming a film on such a surface having holes, the film must be formed over the flat surface and over the bottoms of the holes in a uniform bottom coverage (step coverage). It is desired that bottom coverage (step coverage), i.e., the ratio of the thickness of the film formed on the bottom of a hole to that of the film formed on the flat surface, is 70% or above.

In most cases, various thermal processes follow the film forming process for forming a tungsten nitride film. Strength of adhesion of the tungsten nitride film to the underlying film must be high enough to prevent the peeling of the tungsten nitride film from the underlying film during the thermal processes. When a tungsten nitride film is used as an electrode of a capacitor, (i) there must be low leakage current and (ii) a Schottky barrier must be formed between the tungsten nitride film and an insulating film. When a tungsten nitride film is used as a barrier layer between layers of different materials, the tungsten nitride film must be capable of suppressing the diffusion of those different material.

The present invention has been made to solve those problems and it is therefore an object of the present invention to provide a semiconductor device fabricating method and a semiconductor device fabricating system capable of forming a tungsten nitride film meeting the foregoing requirements.

The film forming method of (1) using $WF_6$ gas and $NH_3$ gas as source gases produces particles of by-products from the source gases.

The present invention has been made to solve this problem and it is therefore an object of the present invention to provide a semiconductor device fabricating method capable of using $WF_6$ gas and $NH_3$ without producing any by-products from $WF_6$ gas and $NH_3$ gas in a film forming chamber or of expelling by-products if by-products are produced, and a semiconductor device fabricating system. It is also an object of the present invention to provide a semiconductor device fabricating method capable of removing by-products produced from $WF_6$ gas and $NH_3$ gas by in-situ cleaning and by keeping the film forming chamber parts to be the proper temperature at which the by-products do not remain.

The inventors of the present invention made studies of the influence of the by-products towards the film quality that are produced when forming tungsten nitride films by using $WF_6$ gas and $NH_3$ gas as source gases, and have found a fact that $NH_6F$ and a compound of $NH_6F$ and W are deposited on the inner surface of walls defining a film forming chamber, those deposits absorb the source gases to reduce film forming efficiency, and the deposits become the source of particles. The inventors of the present invention made studies of temperature of the deposition of the by-products on parts disposed in the film forming chamber and have found a fact that the deposition of the by-product on specific parts can be prevented when the temperatures of the specific parts are kept in a specific temperature range.

According to a first aspect of the present invention, a semiconductor device fabricating method comprises a preparatory process that brings a first source gas containing tungsten atoms into contact with a workpiece and not bringing a second source gas containing nitrogen atoms into contact with the workpiece; and a film forming process that forms a tungsten nitride film on the workpiece by using the first source gas and the second source gas so as to fabricate a semiconductor. This method prevents the peeling of the tungsten nitride film from a layer underlying the same during heat treatment after film forming.

Preferably, the preparatory process comprises the steps of: adjusting process pressure at which the workpiece is processed to a value in the range of 0.1 to 20 torr; heating the workpiece at a temperature in the range of 300 to 500° C.; and adjusting flow rate of the first source gas to a value in the range of 0.5 to 10 sccm or adjusting partial pressure of the first source gas to a pressure in the range of $5 \times 10^{-4}$ to 10 torr. Preferably, the film forming process comprises the steps of: adjusting process pressure at which the workpiece is processed to a value in the range of 0.1 to 50 torr; leading the workpiece at a temperature in the range of 300 to 650° C.; adjusting flow rate of the first source gas to a value in the range of 0.5 to 100 sccm or adjusting partial pressure of the first source gas to a pressure in the range of $5 \times 10^4$ to 50 torr; and adjusting flow rate of the second source gas to a value in the range of 20 to 1000 sccm. For example, the first source gas in tungsten hexafluoride gas and the second source gas is ammonia gas.

According to another aspect of the present invention, a semiconductor device fabricating method comprises a preparatory process that brings either of a first source gas containing tungsten atoms and second source gas containing nitrogen atoms into contact with a workpiece and not bringing the other source gas into contact with the workpiece; and a film forming process that forms a tungsten nitride film on the workpiece by using the first and the second source gas so as to fabricate a semiconductor device.

According to another aspect of the present invention, a semiconductor device fabricating method comprises a film forming process for forming a tungsten nitride film on a workpiece by using a first source gas containing tungsten atoms and a second source gas containing nitrogen atoms, wherein a gas containing silicon atoms is additionally used in the film forming process.

According to another aspect of the present invention, a semiconductor device fabricating method comprises a film forming process for forming a tungsten nitride film on a workpiece by using a first source gas containing tungsten atoms and a second source gas containing nitrogen atoms, and a contact process for bringing a gas containing silicon atoms into contact with the formed tungsten nitride film.

These methods are capable of forming a tungsten nitride film satisfactory in adhesion, coverage, electrical characteristics and performance as a barrier.

Preferably, the method further comprises a nitrogen content increasing process for increasing nitrogen content of a surface layer of the tungsten nitride film. In this case, the nitrogen content increasing process is preferably an annealing process in an atmosphere of a gas containing nitrogen atoms. Alternatively, the nitrogen content increasing process is preferably a plasma-processing process using a plasma of a gas containing nitrogen atoms. Preferably, the method further comprises an oxidizing process for oxidizing a surface of the tungsten nitride film. In this case, the oxidizing process is preferably an annealing process in an oxygen gas atmosphere or an atmosphere of a gas containing oxygen.

According to another aspect of the present invention, a semiconductor device fabricating method comprises a workpiece feed process for providing a workpiece in a film forming chamber defined by a film forming vessel; a temperature adjusting process for adjusting temperature of a gas supply mechanism for supplying source gases into the film forming chamber and of portions of the film forming vessel to be exposed to gases to the temperature capable of preventing the deposition of a by-product produced from tungsten hexafluoride gas and ammonia gas on those portions; and a film forming process for forming a tungsten nitride film on the workpiece by supplying tungsten hexafluoride gas and ammonia gas by the gas supply mechanism into the film forming chamber so as to fabricate a semiconductor device.

This method suppresses the production of the by-products by the interaction of $WF_6$ gas and $NH_3$ gas to maintain the interior of the film forming chamber in a normal condition.

The temperature adjusting process preferably adjusts the temperatures of the gas supply mechanism and of the portions of the film forming vessel to be exposed to gases to values in the range of 100 to 300° C.

The film forming process is preferably followed by: a posterior temperature adjusting process for adjusting the temperatures of the gas supply mechanism and of the portions of the film forming vessel to be exposed to gases to predetermined temperatures; and a gas supply process for supplying chlorine trifluoride gas into the film forming chamber. In this case, the posterior temperature adjusting process preferably adjusts the temperatures of the gas supply mechanism and of the portions of the film forming vessel to be exposed to gases to temperatures in the range of 80 to 500° C.

According to another aspect of the present invention, a semiconductor device fabricating system, for forming a tungsten nitride film on a workpiece, comprises: a film forming vessel defining a film forming chamber in which a workpiece holding device for holding the workpiece is disposed; a first gas supply mechanism provided with a first inlet port and a first outlet port, for supplying a first source gas containing tungsten atoms into the film forming chamber; a second gas supply mechanism provided with a second inlet port and a second outlet port, which are isolated from the first inlet port and the first outlet port of the first gas supply mechanism, for supplying a second source gas containing nitrogen atoms into the film forming chamber; a temperature adjusting mechanism incorporated into the workpiece holding device; an exhautsing mechanism for exhausting gases from the film forming chamber; and a pressure adjusting mechanism for adjusting pressure in the film forming chamber.

The system may further comprises a third gas supply mechanism for supplying chlorine trifluoride gas into the film forming chamber.

According to another aspect of the present invention, a semiconductor device fabricating system, for forming a tungsten nitride film on a workpiece, comprises: a film forming vessel defining a film forming chamber in which a workpiece holding device for holding the workpiece is disposed; a first gas supply mechanism for supplying tungsten hexafluoride gas into the film forming chamber; a second gas supply mechanism for supplying ammonia gas into the film forming chamber; an exhausting mechanism for exhausting gases from the film forming chamber; and a temperature adjusting mechanism for adjusting temperatures of the first gas supply mechanism, the second gas supply mechanism and portions of the film forming vessel to be exposed to gases.

Preferably, the first gas supply mechanism is provided with a first inlet port and a first outlet port, and the second gas supply mechanism is provided with a second inlet port and a second outlet port which are isolated from the first inlet port and the first outlet port.

DESCRIPTION OF THE PREFERRED EMBODIMENTS

Figure 1:
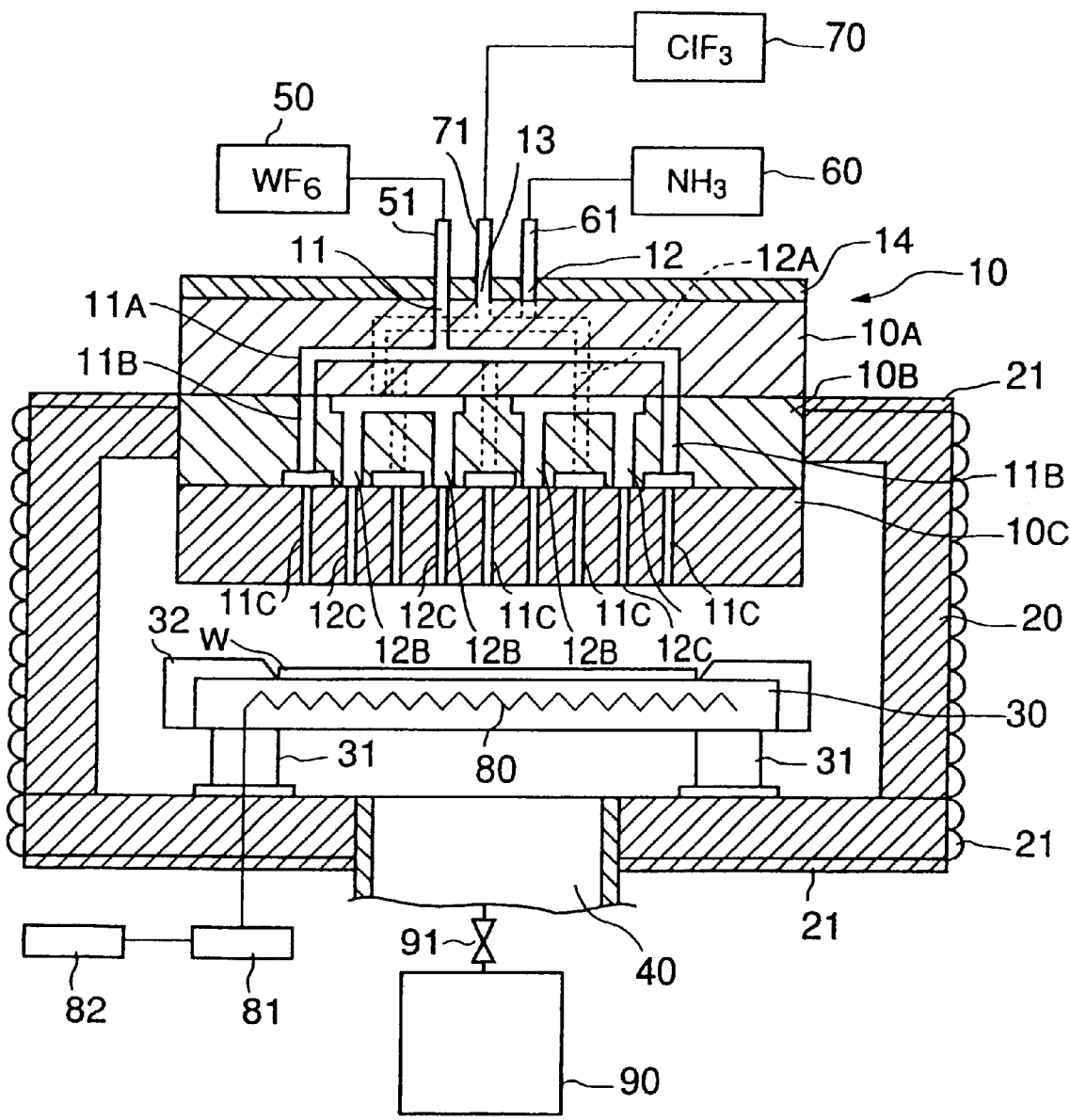
FIG. 1 is a schematic sectional view of a semiconductor device fabricating system in a preferred embodiment of the present invention suitable for carrying out a semiconductor device fabricating method in accordance with the present invention.

A thermal CVD film forming system (hereinafter referred to simply as "film forming system") in a first embodiment of the present invention suitable for carrying out a semiconductor device fabricating method in accordance with the present invention will be described with reference to FIG. 1. Referring to FIG. 1, the film forming system has a gas supply mechanism (shower head) 10 connected to a substantially cylindrical film forming vessel of airtight construction defining a film forming chamber 20 to supply source gases into the film forming chamber 20. A susceptor 30 is disposed in the film forming chamber 20 to hold a workpiece such as a semiconductor water W, in a horizontal position thereon and to heat and adjust the semiconductor wafer W at a desired temperature. An exhaust pipe 40 is connected to the film forming vessel defining the film forming chamber 20 to discharge gases from the film forming chamber 20 during the film forming process for forming a film on the semiconductor wafer W held on the susceptor 30.

A first source gas containing tungsten atoms, such as $WF_6$ gas, and a second source gas containing nitrogen atoms, such as $NH_3$ gas, are supplied through the shower head 10 into the film forming chamber 20 to form a tungsten nitride film on the semiconductor wafer W. The respective flow rates of the first and the second source gases are controlled by mass-flow controllers, not shown. In FIG. 1, indicated at 31 are supporting members of the susceptor 30.

As shown in FIG. 1, the shower head 10 is fitted in an opening formed in a central portion of the upper wall of the film forming vessel defining the film forming chamber 20 so as to project into the film forming chamber with its lower surface of the bottom wall thereof extended in parallel to the holding surface of the susceptor 30. The shower head 10 is constructed by stacking a bottom block 10C, a middle block 10B and a top block 10A in that order.

A first gas inlet port 11 and a second gas inlet port 12 are formed in the top block 10A. The first gas inlet port 11 and the second gas inlet port 12 are connected to a $WF_6$ gas source 50 and an $NH_3$ gas source 60 via pipes 51 and 61, respectively. The first gas inlet port 11 and the second gas inlet port 12 are connected to first branch passages 11A and second branch passages 12A, respectively, in the top block 10A. The branch passages 11A and 12A open with openings substantially uniformly arranged in the etire lower surface of the top block 10A, respectively.

The middle block 10B is provided in its upper surface with openings communicating respectively with the openings of the first branch passages 11A and the second branch passages 12A. First middle passages 11B and second middle passages 12B are formed through the middle block 10B from the openings in its upper surface. That is, the first middle passages 11B and the second middle passages 12B have upper ends connected to the branch passages 11A and 12A, respectively. The lower ends thereof open with openings formed in the lower surface of the middle block 10B.

The bottom block 10C is provided in its upper surface with openings communicating respectively with the lower openings of the first middle passages 11B and the second middle passages 12B. First bottom passages 11C and second bottom passages 12C are formed through the bottom block 10C from the openings in its upper surface. That is, the first bottom passages 11C and the second bottom passages 12C have upper ends connected to the middle passages 11B and 12B, respectively. The lower ends thereof open with openings substantially uniformly arranged in the entire lower surface of the bottom block 10C, respectively.

$WF_6$ gas and $NH_3$ gas supplied from the gas sources 50 and 60 flow through the first gas inlet port 11 and the second gas inlet port 12, respectively, into the shower head 10, and are supplied individually through the bottom passages 11C and 12C into the film forming chamber 20. The $WF_6$ gas and the $NH_3$ gas are mixed uniformly in the film forming chamber 20. Thus, the interaction between the $WF_6$ gas and the $NH_3$ gas can be suppressed.

The shower head 10 is provided with a third gas inlet port 13 formed in the top block 10A, similarly to the first gas inlet port 11 and the second gas inlet port 12. The third gas inlet port 13 is connected to a chloride trifluoride ($ClF_3$) gas source 70 via a pipe 71. The third gas inlet port 13 is communicated to the second top (branch) passages 12A. $ClF_3$ gas supplied through the third gas inlet port 13 into the shower head 10 flows through the second top passages 12A, the second middle passages 12B and the second bottom passage 12C into the film forming chamber 20, as a cleaning gas.

The $ClF_3$ gas may be supplied into the first top (branch) passages 11A instead of into the second top passages 12A. In this case, the $ClF_3$ gas may be supplied into the film forming chamber 20 through the first bottom passages 11C to enhance cleaning effect by the $ClF_3$ gas. Alternatively, the $ClF_3$ gas may be supplied into both the first top passages 11A and the second top passages 12A, and $ClF_3$ gas may be supplied into the film forming chamber 20 through both the first bottom passages 11C and the second bottom passages 12C. In the latter case, check valves, not shown, or the like are necessary to prevent the direct mixing of $WF_6$ gas and $NH_3$ gas in the film forming process.

Diluting gases are further provided through the passages of the shower head 10 which are not shown, for supplying an inert gas, such as argon gas (Ar gas) of nitrogen gas ($N_2$ gas), as a diluting gas for diluting the source gases into the film forming chamber 20.

A shower head heater 14 is attached to the upper surface of the shower head 10. The shower head heater 14 heats the shower head 10 to a desired temperature so as to adjust the temperatures of the source gases, the cleaning gas and the diluting gas to desired temperatures. This prevents deposition of reaction by-products on the surfaces of the shower head 10 exposed to an atmosphere in the film forming chamber 20. Chamber heaters 21 are attached to the outer surfaces of the side wall, the top wall and the bottom wall of the film forming vessel defining the film forming chamber 20 so as to heat the inner surfaces of the film forming vessel defining the film forming chamber 20 at a predetermined temperature suitable for preventing the deposition of reaction by-products on the inner surfaces of the film forming vessel. The shower head heater 14 and the chamber heaters 21 are controlled individually by a controller, not shown.

A guide ring 32 is supported on a peripheral part of the susceptor 30 disposed in the film forming chamber 20 to center a semiconductor wafer W delivered onto the susceptor 30 by a carrying mechanism. A stage heater 80 is embedded in the susceptor 30 to control the temperature of the semiconductor wafer W held on the susceptor 30. A power source 81 and a controller 82 are connected to the stage heater 80. The controller 82 controls power supply from the power source 81 to the stage heater 80.

The exhaust pipe 40 is connected to a vacuum pump 90. A flow regulating valve 91, i.e., flow regulating mechanism, is placed in the exhaust pipe 40 to regulate the flow of gases in the exhaust pipe 40. The opening degree of the flow regulating valve 91 is adjusted to maintain a proper pressure in the film forming chamber 20. Preferably, a trap, i.e., trapping mechanism, is connected to either an inlet port or an outlet port of the vacuum pump 90. Alternatively, traps are connected to the inlet and the outlet port of the vacuum pump 90. The trap or traps are preferably cooled to enhance the trapping efficiency of the same. A structure that reduces the conductance of the discharge side may be also employed. The foregoing features may be employed in combination.

A semiconductor device fabricating method in accordance with the present invention using the film forming system shown in FIG. 1 will be described hereinafter. The semiconductor device fabricating method forms a tungsten nitride film ($WN_x$ film) on a semiconductor wafer W by using a first source gas containing tungsten atoms, such as $WF_6$ gas and a second source gas containing nitrogen atoms, such as $NH_3$ gas. The semiconductor device fabricating method is featured by bringing $WF_6$ gas into contact with a surface of the semiconductor wafer W before forming a $WN_x$ film. The semiconductor device fabricating method is capable of enhancing strength of adhesion of the $WN_x$ film to the semiconductor wafer W and of preventing the peeling of the $WN_x$ film from the semiconductor wafer W in a heat treatment process which is carried out after the formation of the $WN_x$ film.

The vacuum pump 90 is driven for operation, the opening degree of the flow regulating valve 91 is adjusted to evacuate the film forming chamber 20 to a predetermined vacuum. In the meantime, power is supplied to the shower head heater 14, the chamber heaters 21 and the stage heater 80 to heat the shower head 10, the film forming vessel defining the film forming chamber 20 and the susceptor 30 at a predetermined temperatures, respectively. Subsequently, a preparatory process for preparing the film forming chamber 20 is carried out before starting a film forming process for forming a $WN_x$ film. That is, before delivering a semiconductor wafer W into the film forming chamber 20, $WF_6$ gas, Ar gas and $NH_3$ gas are supplied at predetermined flow rates, respectively, into the film forming chamber 20 to coat (pre-coat) the susceptor 30 and components around the susceptor 30 with a $WN_x$ film.

This preparatory process is important because the $WF_6$ gas or the $NH_3$ gas are consumed by the susceptor 30 and the peripheral components and are unable to reach a semiconductor wafer W in the initial stage of the film forming process and a desired $WN_x$ film cannot be formed unless the film forming process is preceded by the preparatory process.

In the preparatory process, the $WF_6$ gas, the $NH_3$ gas and the Ar gas are supplied individually from the respective gas sources including the gas sources 50 and 60 into the shower head 10 through gas supply pipes including the pipes 51 and 61, and the gas inlet ports including the first gas inlet port 11 and the second gas inlet port 12. The $WF_6$ gas, the $NH_3$ gas and the Ar gas flow through the top passages 11A and 12A, the middle passages 11B and 12B and the bottom passages 11C and 12C and are sprayed into the film forming chamber 20. Consequently, the $WF_6$ gas, the $NH_3$ gas and the Ar gas are mixed uniformly in the film forming chamber 20. The respective flow rates of the $WF_6$ gas, the $NH_3$ gas and the Ar gas may be the same as those for the film forming process for forming a $WN_x$ film on a semiconductor wafer W. After the $WF_6$ gas, the $NH_3$ gas and the Ar gas have individually been supplied into the film forming chamber 20 for a predetermined time, for example, 20 odd minutes, $WN_x$ films are formed over the susceptor 30 and the peripheral components.

After the preparatory process has been completed, a surface treatment process is carried out to treat a surface of a semiconductor wafer W before the film forming process. A 200 Å thick gate oxide film and a 500 Å thick poly-Si film are formed in that order on the surface of the semiconductor wafer W. The semiconductor wafer W is carried into the film forming chamber 20, is held on the susceptor 30 and is heated to a predetermined temperature. Subsequently, the shower head 10 and the film forming vessel defining the film forming chamber 20 are heated to predetermined temperatures, respectively, and the $WF_6$ gas and the Ar gas are supplied individually into the film forming chamber at predetermined flow rates for a predetermined time on the order of 10 s. At this stage, the film processing chamber 20 is set at a predetermined pressure to make $WF_6$ gas react with the poly-Si film for the surface treatment of the poly-Si film.

The semiconductor wafer W is heated and adjusted at a temperature in the range of 300 to 500° C., preferably, in the range of 450 to 500° C. A film may be deposited at a deposition rate lower than the lower limit of an allowable range of deposition rate if the temperature of the semiconductor wafer W is below 300° C. A film may be deposited at an excessively high deposition rate if the temperature of the semiconductor wafer W is higher than 500° C. In the latter case, the control of film thickness is difficult particularly in case of forming a thin film.

The predetermined flow rate of $WF_6$ gas is in the range of 0.5 to 10 sccm, preferably, in the range of 0.5 to 2 sccm; that is, the partial pressure of $WF_6$ gas in the film forming chamber 20 is maintained in the range of $5\times10^4$ to 10 torr, preferably, in the range of $5\times10^{-4}$ to 0.5 torr. If the flow rate of $WF_6$ gas is below 0.5 sccm, the reaction of $WF_6$ gas with the poly-Si film formed on the surface of the semiconductor wafer W is insufficient, the surface of the semiconductor wafer W cannot sufficiently be activated and it is possible that a film is deposited on the surface of the semiconductor wafer W at a deposition rate below the lower limit of an allowable range of deposition rate. If the flow rate of $WF_6$ gas is higher than 10 sccm, it is possible that the deposition rate of a film on the surface of the semiconductor wafer W is excessively high and the control of film thickness is difficult in forming a thin film.

The process pressure of the film forming chamber in case of processing the surface of the poly-Si film is in the range of 0.1 to 20 torr, preferably, in the range of 0.3 to 3 torr. The deposition rate of the film decreases below the lower limit of an allowable range of deposition rate when the process pressure is below 0.1 torr. If the process pressure is higher than 20 torr, the deposition rate of the film is excessively high and it is possible that the control of film thickness is difficult when forming a thin film.

After the completion of the surface treatment process, the film forming process is carried out to form a $WN_x$ film, i.e., a barrier film. $WF_6$ gas, $NH_3$ gas and Ar gas are supplied at predetermined flow rates, respectively, for a predetermined time such as 10 s, through the shower head 10 into the film forming chamber 20. Then, a $WN_x$ film is formed over the poly-Si film formed on the surface of the semiconductor wafer W held on the susceptor 30 and adjusted at a predetermined temperature. Subsequently, a 1000 Å thick W film is formed over the $WN_x$ film by a common W-CVD process. When the semiconductor wafer W is subjected to a reflowing process for reflowing BPSG forming a layer insulating film after the film forming process, the semiconductor wafer W is exposed to heat of a predetermined temperature in the range of, for example, 850 to 900° C.

The temperature of the semiconductor wafer W is adjusted to a temperature in the range of 300 to 650° C., preferably, in the range of 450 to 550° C. The $WN_x$ film is liable to become amorphous and is liable to peel off after RTN when the temperature of the semiconductor wafer W is below 300° C. When the temperature of the semiconductor wafer W is higher than 650° C., the temperature of the semiconductor wafer W is higher than the withstand temperature of a layer insulating film when the $WN_x$ film is used as a barrier film for Cu wiring lines.

The predetermined flow rate of $WF_6$ gas is, for example, in the range of 0.5 to 100 sccm, preferably, in the range of 1 to 50 sccm. When the flow rate of $WF_6$ gas is below 0.5 sccm, it is possible that the $WN_x$ film is deposited at a deposition rate below the lower limit of an allowable range of deposition rate. The $WN_x$ film is liable to become amorphous and is liable to peel off after RTN when the flow rate of $WF_6$ gas is above 100 sccm.

The predetermined flow rate of $NH_3$ gas is, for example, in the range of 20 to 1000 sccm, preferably, in the range of 150 to 500 sccm. When the flow rate of $NH_3$ gas is below 20 sccm, if is possible that the $WN_x$ film is liable to become amorphous and is liable to peel off after RTN. When the flow rate of $NH_3$ gas is above 1000 sccm, it is possible that the partial pressure of $WF_6$ gas is reduced excessively and that the $WN_x$ film is deposited at a deposition rate below the lower limit of an allowable range of deposition rate.

The predetermined flow rate of Ar gas is, for example, in the range of 10 to 3000 sccm, preferably, in the range of 50 to 2000 sccm. When the flow rate of Ar gas is below 10 sccm, it is possible that the $WF_6$ gas diffuses into an $NH_3$ gas supply line or the $NH_3$ gas diffuses into a $WF_6$ gas supply line, that particles are produced by the interaction of the $NH_3$ gas and the $WF_6$ gas, and that the pipes are clogged with the particles. When the flow rate of Ar gas is above 3000 sccm, it is possible that the partial pressure of $WF_6$ gas is reduced excessively and that the deposition rate drops below the lower limit of an allowable range of deposition rate.

The process pressure in the film forming chamber 20 for processing the semiconductor wafer W by the film forming process for forming the $WN_x$ film is in the range of 0.1 to 50 torr, preferably, in the range of 0.3 to 3 torr. The $WN_x$ film is deposited at a deposition rate below the lower limit of an allowable range of deposition rate when the process pressure is below 0.1 torr. When the process pressure is above 50 torr, it is possible that the deposition rate is excessively high and tha the control of film thickness is difficult in case of forming a thin film.

Examples of the semiconductor device fabricating method in accordance with the present invention will be described hereinafter.

EXAMPLE 1

The preparatory process specified by process conditions mentioned below was carried out to coat the susceptor and the peripheral components with a precoating $WN_x$ film. A semiconductor wafer was held on the susceptor and the same preparatory process was carried out to form a $WN_x$ film on a surface of the semiconductor wafer. In the preparatory process, the temperature of the semiconductor wafer held on the susceptor was lower than that of the susceptor by 56° C. The thickness of the $WN_x$ film formed on the susceptor and the peripheral components must be greater than that of the $WN_x$ film formed on the semiconductor wafer when the $WN_x$ films are formed under the same process conditions. The measured thickness of the $WN_x$ film formed on the semiconductor wafer was about 1.5 μm and hence it is supposed that the thickness of the $WN_x$ film formed on the susceptor and the peripheral components is about 1.5 μm or above.

[Process Conditions for Preparatory Process]
(1) Conditions for Semiconductor Device Fabricating System
  (i) Pressure in chamber: 0.3 torr
  (ii) Temperature of inner surface of vessel: 170° C.
  (iii) Temperature of shower head: 170° C.
  (iv) Temperature of susceptor: 506° C.
(2) Source Gases for Preparatory Process
  (i) First step
    $WF_6$/$NH_3$/Ar/$N_2$ flow rates: 2/50/100/100 sccm
    Processing time: 60 s
  (ii) Second step
    $WF_6$/$NH_3$/Ar/$N_2$ flow rates: 10/50/100/100 sccm
    Processing time: 1360 s The following process conditions may be used instead of the foregoing process conditions.
(1)' Conditions for Semiconductor Device Fabricating System
  (i) Pressure in chamber: 1 torr
  (ii) Temperature of inner surface of vessel: 130° C.
  (iii) Temperature of shower head: 150° C.
  (iv) Temperature of susceptor: 506° C.
(2)' Source Gases for Preparatory Process
  (i) First Step
    Pressure in chamber: 1 torr
    $WF_6$/$NH_3$/Ar/$N_2$ flow rates: 1/500/500/500 sccm
    Processing time: 120 s
  (ii) Second step
    Pressure in chamber: 1 torr
    $WF_6$/$NH_3$/Ar/$N_2$ flow rates: 50/500/500/500 sccm
    Processing time: 720 s After the completion of the preparatory process, a semiconductor water provided with a 500 Å thick poly-Si film and a 200 Å thick gate oxide film thereon was placed on the susceptor, and the surface of the poly-Si film formed on the semiconductor wafer was treated by using $WF_6$ gas, and then a $WN_x$ film was formed over the poly-Si film by processes specified by the following process conditions.

[Process Conditions for Surface Treatment Process]
(1) Conditions for Semiconductor Device Fabricating System
  (i) Pressure in chamber: 0.3 torr
  (ii) Temperature of inner surface of vessel: 170° C.
  (iii) Temperature of shower head: 170° C.
  (iv) Temperature of susceptor: 506° C.
  (v) Surface temperature of semiconductor wafer: 450° C.
(2) $WF_6$/$NH_3$/Ar/$N_2$ flow rates: 1.3/0/100/100 sccm
  Processing time: 10 s

[Process Conditions for Film Forming Process]
(1) Conditions for Semiconductor Device Fabricating System
  The same as the surface treatment process
(2) $WF_6$/$NH_3$/Ar/$N_2$ flow rates: 2/50/100/100 sccm
  Processing time: 10 s The sheet resistance of the $WN_x$ film forme by the film forming process was measured by a four-probe method. The measured sheet resistivity was 185 Ω/sq. The thickness of the laminated film including the base layer as measured through observation using a SEM was 250 Å. Therefore, the resistivity of the laminated film was 462 uΩ-cm.

A 1000 Å thick W film (tungsten film) was formed on the $WN_x$ film by an ordinary W-CVD process. The sheet resistivity of the W/$WN_x$ film as measured by a four-probe method was as low as 1.314 Ω/sq. The W/$WN_x$ film was subjected to a thermal stability test to test the adhesion of the W/$WN_x$ film after annealing. The semiconductor wafer provided with the W/$WN_x$ film was subjected to a rapid thermal annealing process (RTA process), in which the W/$WN_x$ film was heated at 900° C. for 600 s. The performance of the W/$WN_x$ film as a barrier layer was evaluated on the basis of change in the sheet resistance after RTA process and on the basis of analysis by SIMS (secondary ion mass spectrometry). The adhesion of the W/$WN_x$ film was evaluated on the basis of results of RTA. If the ability of the W/$WN_x$ film as a barrier layer is nullified, silicon atoms (Si atoms) may diffuse into the W film and, consequently, the sheet resistivity of the W film may increase. In the case, the SIMS analysis of the W/$WN_x$ film will prove the diffusion of Si atoms into the W film or the diffusion of W atoms into the poly-Si film. If the adhesion between the W film and the $WN_x$ film or between the W/$WN_x$ film and the poly-Si film is insufficient, the films would be separated from each other after RTA. The evaluation of the semiconductor wafer processed by the semiconductor device fabricating method of Example 1 showed that the sheet resistivity of the W/$WN_x$ film after RTA was 1.111 Ω/sq., which is smaller than the sheet resistivity of the W/$WN_x$ film as measured before RTA. The diffusion of W atoms in the poly-Si film and separation of the films were not observed by back SIMS. It is inferred that the sheet resistivity was reduced because there was no diffusion of Si atoms into the W/$WN_x$ film and large W crystal grains were grown in the W film.

As obvious from the foregoing description, the W/$WN_x$/poly-Si film formed by semiconductor device fabricating method of this example has no problem in performance as a barrier layer and adhesion. The heat treatment of the W film makes W crystal grains of the W film grow greater and reduces the resistance of the W film. Thus, it was found that the surface treated W/$WN_x$/poly-Si film forms a very excellent gate electrode structure. A reaction layer formed by the interaction of $WF_6$ gas and the poly-Si film has a low resistance. It was found that the reaction layer serves as a current path when the $WN_x$ film formed on the poly-Si film is sufficiently thin less than 500 Å. The apparent resistivity of the $WN_x$ film can be reduced by this current path. It was also found that, in a special case where the reaction layer is very effective in resistance reduction, the apparent resistivity of the $WN_x$ film is as low as $1/10$ of the $WN_x$ film formed on a poly Si film without surface-treatment by $WF_6$ gas. This result shows that the surface treatment of the poly-Si film with $WF_6$ gas is effective in reducing the resistance of the gate.

After a predetermined number of semiconductor wafers were processed by the film forming process specified by the foregoing process conditions, the film forming chamber was cleaned by a cleaning process, in which the susceptor was maintained at 300° C., the inner surface of the film forming vessel and the shower head were maintained at 100° C., and $ClF_3$ gas and Ar gas were used as cleaning gases and were supplied simultaneously into the film forming chamber. After the completion of the cleaning process, heating of the film forming vessel, the susceptor and the shower head was stopped and the film forming vessel, the susceptor and the shower head were left to cool to an ordinary temperature. The film forming vessel was opened and the interior of the film forming vessel was examined visually. The surfaces of the film forming vessel, the susceptor and the shower head were as clean as they were before the film forming process; that is, the interior of the film forming vessel could satisfactorily cleaned by the cleaning process.

[Conditions for Cleaning Process]
(1) Pressure in film forming chamber: 1 torr
(2) $ClF_3$/Ar gas flow rates: 500/50 sccm
(3) Cleaning time: 600 s The cleaning process may be specified by the following conditions.
(1) Pressure in film forming chamber: 3 torr
(2) $ClF_3$/Ar gas flow rates: 300/50 sccm
(3) Cleaning time: 900 s

EXAMPLE 2

A semiconductor device fabricating method in Example 2 formed a W/$WN_x$/poly-Si film on a semiconductor wafer having a poly-Si film on its surface by the same process conditions as those for Example 1. Subsequently, a $WN_x$/W/$WN_x$/poly-Si film was formed by forming a $WN_x$ film on the surface of the W film by the same surface treatment process and film forming process as in Example 1. Then, the semiconductor wafer was heated at 850° C. for 60 min in an annealing furnace for a heat-treatment process. It was found that the $WN_x$ film formed on the W film increases the oxidation resistance of the W/$WN_x$/poly-Si film. When the heating temperature of the annealing furnace was 500° C., the W film of the W/$WN_x$/poly-Si film without the uppermost $WN_x$ was oxidized. Thus, it was found that the uppermost $WN_x$ of the $WN_x$/W/$WN_x$/poly-Si film functions as a protective film for preventing the oxidation of the W film. Thus, the $WN_x$/W/$WN_x$/poly-Si film forms a highly oxidation-resistant gate electrode. Consequently, the heating temperature of the annealing furnace can be raised, the control of the oxygen gas concentration of the atmosphere in the furnace can be simplified and therefore the efficiency of the heat-treatment process can be improved.

EXAMPLE 3

A semiconductor device fabricating method in Example 3 formed a $WN_x$ film and a W film on a poly-Si film by the same process conditions as those in Example 1, except that the susceptor was heated at 456° C. to heat a semiconductor wafer held on the susceptor at 400° C., as shown in Table 1. The semiconductor wafer thus processed was used as Sample 1. Process conditions for Example 3 and measured values of parameters indicating the quality of Sample 1 are tabulated in Table 1. Strength of adhesion of the $WN_x$ film to the poly-Si film was measured by a known measuring method and the condition of Sample 1 after RTA (900° C., 60 s) was examined. Result of examination is shown in Table 1.

COMPARATIVE EXAMPLE 3-1

A semiconductor device fabricating method in Comparative example 3-1 was carried out the same as in Example 3, except that Comparative example 3-1 did not include any surface treatment process using $WF_6$ gas. A $WN_x$ film and a W film were formed on a semiconductor wafer. The semiconductor wafer thus processed was used as Sample 2. Process conditions for Comparative example 3-1 and measured values of parameters indicating the quality of Sample 2 are shown in Table 1.

TABLE 1

| Sample No. | Film forming pressure (torr) | $WF_6$/$NH_3$/AR/$N_2$ (sccm) | Wafer temperature (° C.) | Surface treatment | Adhesion (kgf/cm²) | Peeling after RTN |
|---|---|---|---|---|---|---|
| 1 | 0.3 | 1.3/0/100/100<br>2/50/100/100 | 400.00 | Treated | (max) 808.0<br>(min) 737.0 | Not peeled |
| 2 | 0.3 | 2/50/100/100 | 400.00 | Not Treated | (max) 268.0<br>(min) 118.5 | Peeled |

As obvious from Table 1, the adhesion of the W/$WN_x$/poly-Si film of Sample 2 formed by Comparative example 3-1 not including the surface treatment process using $WF_6$ gas is very low as compared with that of Sample 1 formed by Example 3. The W/$WN_x$/poly-Si film of Sample 2 was also delaminated by RTA.

EXAMPLE 4

A semiconductor device fabricating method in Example 4 was carried out the same as in Example 3, except that Example 4 continued a film forming process for forming a $WN_x$ film for 20 s. That is, the surface treatment process was carried out to a poly-Si film formed on the semiconductor wafer, a $WN_x$ film was formed on the poly-Si film and a W film was formed on the $WN_x$ film. The semiconductor wafer thus processed was used as Sample 3. Process conditions for Example 4 and the condition of the W/$WN_x$/poly-Si film after heat treatment are shown in Table 2.

COMPARATIVE EXAMPLE 4-1

A semiconductor device fabricating method in Example 4-1 was carried out the same as in Comparative example 3-1, except that Comparative example 4-1 continued a film forming process for forming $WN_x$ films for each time in Table 2 and the surface temperature of some semiconductor wafer increased to 450° C. W/$WN_x$/poly-Si films were formed on semiconductor wafers to provide Samples 4 to 7, following the process conditions shown in Table 2.

TABLE 2

| Sample No. | Film forming pressure (torr) | $WF_6$/$NH_3$/Ar/$N_2$ (sccm) | Wafer temperature (° C.) | Surface treatment | Film forming time (s) | Peeling after treatment |
|---|---|---|---|---|---|---|
| 3 | 0.3 | 1.3/0/100/100<br>2/50/100/100 | 400.00 | Treated | 20 | Not peeled |
| 4 | 0.3 | 2/50/100/100 | 400.00 | Not treated | 20 | Peeled |
| 5 | 0.3 | 2/50/100/100 | 400.00 | Not treated | 20 | Peeled |
| 6 | 0.3 | 2/50/100/100 | 400.00 | Not treated | 10 | Peeled |
| 7 | 0.3 | 2/50/100/100 | 400.00 | Not | 5 | Peeled |

TABLE 2-continued

| Sample No. | Film forming pressure (torr) | WF$_6$/NH$_3$/Ar/N$_2$ (sccm) | Wafer temperature (° C.) | Surface treatment | Film forming time (s) | Peeling after treatment |
|---|---|---|---|---|---|---|
| | | | | treated | | |

As obvious from Table 2, Samples 4 to 7 formed by Comparative example 4-1 not including the surface treatment process using WF$_6$ gas were delaminated. Sample 3 formed by Example 4 was not laminated.

EXAMPLE 5

Semiconductor device fabricating methods in Examples 5-1 to 5-4 formed WN$_x$ films according to different process conditions so as to examine film forming conditions using process gases having a low fluorine concentration for forming WN$_x$ films for polymetal gate electrodes.

EXAMPLE 5-1

A 50 Å thick gate oxide film and a 500 Å thick poly-Si film were formed in that order on a surface of a semiconductor. The semiconductor wafer was mounted on the susceptor disposed in the film forming chamber, and a WN$_x$ film of about 200 Å was formed on the poly-Si film by a film forming process specially by process conditions shown below. Distribution of fluorine (F) content of the WN$_x$ film with respect to depth was analyzed by SIMS. A middle portion of the WN$_x$ film, with respect to thickness, which is not affected significantly by the interface, was as small as $2.0 \times 10^{19}$ atoms/cm$^3$. The F content of samples produced by semiconductor device fabricating methods in the following other examples and comparative examples are represented by F content in a middle portion thereof, like this example.

[Film Forming Process]
(1) Conditions for Semiconductor Device Fabricatin System
  (i) Pressure in chamber: 3 torr
  (ii) Surface temperature of wafer: 600° C.
(2) Source Gases
  WF$_6$/NH$_3$/Ar/N$_2$ flow rates: 0.5/500/2000/2000 sccm
  WF$_6$ gas concentration: 0.01% by volume
  Ar gas and N$_2$ gas were used as carrier gases for the WF$_6$ gas line and the NH$_3$ gas line, respectively.

EXAMPLE 5-2

A semiconductor device fabricating method in Example 5-2 was carried out the same as in Example 5-1 form a laminated W/WN$_x$/poly-Si film of polymetal gate construction by sequentially forming a 100 Å thick WN$_x$ film on a poly-Si film and a 1000 Å thick W film on the WN$_x$ film. The laminated W/WN$_x$/poly-Si film as deposited (as depo) had a sheet resistance of 1.34 Ω/sq. The sheet resistance of the laminated W/WN$_x$/poly-Si film was reduced to 1.03 Ω/sq when the laminated W/WN$_x$/poly-Si film was treated by RTA in a N$_2$ gas atmosphere at 900° C. for 600 s. The sheet resistances of Both the laminated W/WN$_x$/poly-Si film as deposited and the laminated W/WN$_x$/poly-Si film treated by RTA were low enough to form a low-resistive gate electrode. The WN$_x$ film treated by RTA was not inferior to that formed by Example 1 in adhesion and performance as barrier, by means of the methods for examination the same as in Example 1.

EXAMPLE 5-3

A semiconductor device fabricating method in Example 5-3 was carried out the same as in Example 5-1 to form a WN$_x$ film, except that the flow rate of WF$_6$ in the film forming process was reduced to 0.1 sccm. The WN$_x$ film had a further reduced F content of $1.8 \times 10^{19}$ atoms/cm$^3$. The WF$_6$ gas concentration in the film forming process was 0.002% by volume.

EXAMPLE 5-4

A semiconductor device fabricating method in Example 5-4 was carried out the same as in Example 5-1 to form a WN$_x$ film, except that the surface temperature of the semiconductor wafer was raised to 650° C. The WN$_x$ film had a further reduced F content of $1.5 \times 10^{19}$ atoms/cm$^3$. The WF$_6$ gas concentration in the film forming process was 0.01% by volume.

COMPARATIVE EXAMPLE 5-1

A semiconductor device fabricating method in Comparative example 5-1 was carried out the same as in Example 5-1 to form a WN$_x$ film, except that the surface temperature of the semiconductor wafer was reduced to 450° C. The WN$_x$ film had a F content of $8.0 \times 10^{20}$ atoms/cm$^3$, which was greater by one figure than that of the WN$_x$ film formed by Example 5-1.

COMPARATIVE EXAMPLE 5-2

A semiconductor device fabricating method in Comparative example 5-2 was carried out the same as in Example 5-1 to form a WN$_x$ film, except that the respective flow rates of Ar gas and N$_2$ gas were reduced to 100 sccm. The F content of the WN$_x$ film was $3.7 \times 10^{19}$ atoms/cm$^3$, which was greater than that of the WN$_x$ film formed by Example 5-1.

The same procedures as in Example 5-1 except that only the flow rate of Ar gas as a carrier gas for the WF$_6$ line was reduced to 100 sccm, were carried out to form a WN$_x$ film. The F content of the WN$_x$ film was thus formed $2.8 \times 10^{19}$ atoms/cm$^3$, which was greater than that of the WN$_x$ film formed by Example 5-1.

The same procedures as in Example 5-1 except that only the flow rate of N$_2$ gas as a carrier gas for the NH$_3$ line was reduced to 100 sccm, were carried out to form a WN$_x$ film. The F content of the WN$_x$ film thus formed was $3.4 \times 10^{19}$ atoms/cm$^3$, which was greater than that of the WN$_x$ film by Example 5-1.

In those film forming processes, the WF$_6$ gas concentration of the mixed process gas in the film forming process was in the range of 0.02 to 0.07% by volume.

COMPARATIVE EXAMPLE 5-3

A semiconductor device fabricating method in Comparative example 5-3 was carried out the same as in Example 5-1 to form a WN$_x$ film, except that the flow rate of WF$_6$ gas was raised to 2 sccm. The F content of the WN$_x$ film was $3.0 \times 10^{29}$ atoms/cm$^3$, which was greater than that of the WN$_x$ film formed by Example 5-1. The WF$_6$ gas concentration in the film forming process was 0.4% by volume.

COMPARATIVE EXAMPLE 5-4

A semiconductor device fabricating method in Comparative example 5-4 was carried out the same as in Example 5-1 to form a WN$_x$ film, except that the pressure in the film forming chamber was reduced to 0.3 torr. The F content of the $WN_x$ film was $1.1\times10^{20}$ atoms/cm$^3$, which was greater than that of the $WN_x$ film formed by Example 5-1.

It was found from the results of film forming experiments of Examples 5-1 to 5-4 and Comparative examples 5-1 to 5-4 that heating the surface of the semiconductor wafer at a temperature in the range of 600 to 650° C. and maintaining the film forming chamber at a pressure of about 3 torr are suitable process conditions for forming a $WN_x$ film having a small F content. According to the foregoing suitable process conditions, $WN_x$ films having a low F content could be formed for $WF_6$ concentrations in a wide range. It was found that a suitable ratio of $WF_6$ gas flow rate to mixed process gas flow rate is in the range of 0.002 to 0.07% by volume, preferably, in the range of 0.002 to 0.01% by volume.

EXAMPLE 6

Semiconductor device fabricating methods in Examples 6-1 to 6-4 according to different process conditions were carried out to examine film forming conditions for forming a $WN_x$ film satisfactory in both coverage (bottom coverage) and adhesion for use as the lower electrode of a capacitor of metal/insulator/metal construction.

EXAMPLE 6-1

A semiconductor wafer having a surface coated with an oxide film provided with holes of 0.25 µm in diameter and 0.7 µm in depth was mounted on the susceptor disposed in the film forming chamber, and a $WN_x$ film having a flat portion of about 300 Å in thickness surrounding the holes was formed on the oxide film by a film forming process specified by the following film forming conditions. The bottom coverage (step coverage) of the $WN_x$ film, i.e., the ratio of the thickness of a portion of the $WN_x$ film formed on the bottom of the hole to that of the flat portion of the $WN_x$ film surrounding the hole, was about 70% through observation using a SEM. The adhesion of the $WN_x$ film as deposited and that of the $WN_x$ film as processed by RTA (at 650° C. for 60 s in a $N_2$ atmosphere) were evaluted on the basis of results of tape tests. Both the $WN_x$ as deposited and the $WN_x$ film as processed by RTA were not peeled.

A semiconductor wafer having a surface coated with a laminated film on TiN/Ti/low-resistance Si construction formed by a PVD process was mounted on the susceptor disposed in the film forming chamber, and a $WN_x$ film of about 300 Å in thickness was deposited on the laminated film to form a lower electrode layer. A $Ta_2O_9$ film of a thickness in the range of 9 to 10 nm as a capacitor insulating film was formed by a CVD process. A TiN film as an upper electrode layer was formed on the $Ta_2O_9$ film by a PVD process. Only the upper electrode layer was patterned into an upper electrode to complete a capacitor between the back surface of the semiconductor wafer and the upper electrode. A positive bias and a negative bias were applied to the upper electrode, and capacitance and leakage current were measured. Voltages that provide an oxide-equivalent effective film thickness $T_{off}$ of 1.2 nm and a leakage current density of $1\times10^9$ A/cm$^2$ was ±0.7 V.
[Film Forming Process]
(1) Conditions for Semiconductor Device Fabricating System
   (i) Pressure in chamber: 1 torr
   (ii) Surface temperature of semiconductor wafer: 450° C.
(2) Source Gases flow rates
   $WF/_6$/$NH_3$/Ar/$N_2$ flow rates: 20/500/500/500 sccm
   $NH_3$/$WF_6$ flow rate ratio: 25
   $WF_6$ concentration: 1.3% by volume
   Ar gas and $N_2$ gas were used as carrier gases for the $WF_6$ gas line and the $NH_3$ gas line, respectively.

EXAMPLE 6-2

A semiconductor device fabricating method in Example 6-2 was carried out the same as in Example 6-1 to form a $WN_x$ film, except that the flow rate of $WF_6$ gas was increased to 50 sccm. The bottom coverage (step coverage) of the $WN_x$ film thus formed was about 100%, which was greater than that of the $WN_x$ film formed by Example 6-1. The $WN_x$ film was equal to that formed by Example 6-1 in adhesion and electrical characteristics. The $NH_3$/$WF_6$ flow rate ratio was 10, and the concentration of $WF_6$ gas in the film forming process was about 3.2% by volume.

EXAMPLE 6-3

A semiconductor device fabricating method in Example 6-3 was carried out the same as in Example 6-1 to form an about 300 Å thick $WN_x$ film for use as a lower electrode, except that film forming conditions shown below were used. The bottom coverage (step coverage), of the $WN_x$ film was evaluated through observation using a SEM. The bottom coverage (step coverage) was about 100%. The adhesion of the $WN_x$ film as deposited and that of the $WN_x$ film as processed by RTA (at 750° C. for 60 s in a $N_2$ atmosphere) were evaluated on the basis of result of tape test. Both the $WN_x$ film as deposited and the $WN_x$ film as processed by RTA were not peeled off. Voltages that provide an oxide-equivalent effective film thickness $T_{off}$ of 1.3 nm and a leakage current density of $1\times10^{-8}$ A/cm$^2$ was ±0.7 V.
[Film Forming Process]
(1) Conditions for Semiconductor Device Fabricating System
   (i) Pressure in chamber: 3 torr
   (ii) Surface temperature of semiconductor wafer: 400° C.
(2) Source Gas flow rates
   $WF_6$/$NH_3$/Ar/$N_2$ flow rates: 100/50/100/100 sccm
   $NH_3$/$WF_6$ flow rate ratio: 0.5
   $WF_6$ concentration: 28.6% by volume
   Ar gas and $N_2$ gas were used as carrier gases for the $WF_6$ gas line and the $NH_3$ gas line, respectively.

EXAMPLE 6-4

A semiconductor device fabricating method in Example 6-4 was carried out the same as in Example 6-1, except that the temperature of the semiconductor wafer was 300° C., the pressure in the film forming chamber was 0.5 torr and the thickness of the $WN_x$ film was 500 Å. The bottom coverage (step coverage) of the $WN_x$ film through observation using a SEM was about 100%. The adhesion of the $WN_x$ film as deposited and that of the $WN_x$ film as processed by RTA (at 650° C. for 60 s in a $N_2$ atmosphere) were evaluated on the basis of results of tape tests. Both the $WN_x$ film as deposited and the $WN_x$ film as processed by RTA were not peeled. Voltages that provide an oxide-equivalent effective film thickness $T_{off}$ of 1.3 nm and a leakage current density of $1\times10^{-8}$ A/cm$^2$ was ±0.7 V.

COMPARATIVE EXAMPLE 6-1

A semiconductor device fabricating method in Comparative example 6-1 was carried out the same as in Example 6-1 to form a $WN_x$ film, except that the flow rate of $WF_6$ gas in the film forming process was reduced to 2 sccm and the NH$_3$/WF$_6$ flow rate ratio was raised to 250. The bottom coverage (step coverage) of the WN$_x$ film was reduced to about 15%. The WF$_6$ gas concentration of the mixed process gas for the film forming process was 0.13% by volume.

COMPARATIVE EXAMPLE 6-2

A semiconductor device fabricating method in Comparative example 6-2 was carried out the same as in Example 6-3, except that a 3000 Å thick WN$_x$ film was formed. The coverage (step coverage) of the WN$_x$ film was equal to that of the WN$_x$ film formed by Example 6-3. However, the WN$_x$ film peeled off when subjected to a tape test. The WF$_6$ gas concentration of the mixed process gas for the film forming process was 28% by volume. The NH$_3$/WF$_6$ flow rate ratio was 0.5.

COMPARATIVE EXAMPLE 6-3

A semiconductor device fabricating method in Comparative example 6-3 was carried out the same as in Example 6-1 to form a WN$_x$ film, except that the temperature of the semiconductor wafer for the film forming process was raised to 600° C. The bottom coverage (step coverage) of the WN$_x$ film formed by Comparative example 6-3 was reduced to about 20%. The WF$_6$ gas concentration of the mixed process gas for the film forming process was 1.3% by volume. The NH$_3$/WF$_4$ flow rate ratio was 25.

COMPARATIVE EXAMPLE 6-4

A semiconductor device fabricating method in Comparative example 6-4 was carried out the same as in Example 6-1 to form a WN$_x$ film, except that the pressure in the film forming chamber in the film forming process was raised to 10 torr. The bottom coverage (step coverage) of the WN$_x$ film formed by Comparative example 6-4 was reduced to about 40%. The WF$_6$ gas concentration of the mixed process gas for the film forming process was 1.3% by volume. The NH$_3$/WF$_6$ flow rate ratio was 25.

It was found from the results of film forming experiments of Examples 6-1 to 6-4 and Comparative examples 6-1 to 6-4 that film forming conditions desirable in view of coverage (step coverage) and adhesion include: heating the semiconductor wafer at a temperature in the range of 300 to 450° C., maintaining the film forming chamber at a pressure in the range of 0.5 to 3 torr, and using a mixed process gas have a WF$_6$ concentration in the range of about 1 to 30% by volume or supplying NH$_3$ gas and WF$_6$ gas at a NH$_3$/WF$_6$ flow rate ratio in the range of 0.5 to 25. Preferably, the thickness of the WN$_x$ film is 500 Å or below.

Figure 2:
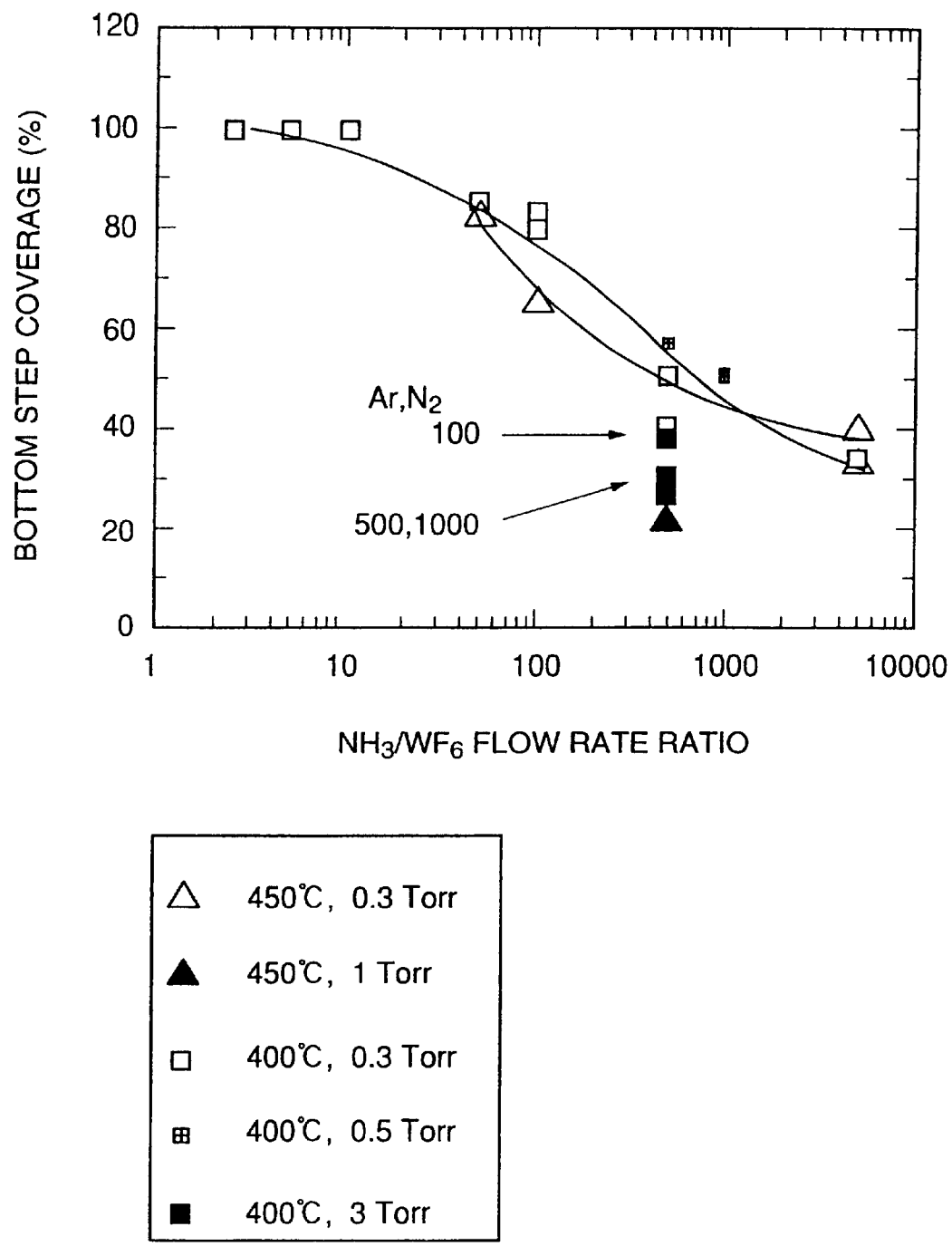
FIG. 2 is a graph showing the dependence of bottom coverage (step coverage) for a hole of 0.35 $\mu$m in diameter and 1.34 $\mu$m in depth on $NH_3/WF_6$ flow rate ratio.

Conditions necessary for forming the lower electrode of a capacitor, which is excellent in coverage (step coverage) and adhesion, are examined as below. WN$_x$ films were formed by using different film forming conditions, respectively, on a surface of a film provided with holes of 0.35 μm in diameter and about 1.34 μm in depth, and the condition of the formed films was observed by using a SEM. Results of observation are shown in FIG. 2. It was found from the results shown in FIG. 2 that films satisfactory in coverage (step coverage) can be formed when the following conditions are satisfied.

(1) Low film forming temperature (Compare Δ▲ and □■ in FIG. 2)
(2) Low NH$_3$ flow rate
(3) Small NH$_3$/WF$_6$ flow rate ratio
(4) Low-pressure film formation (compare 0.3 Torr, 0.5 Torr, 3 Torr in FIG. 2)
(5) Low carrier gas (Ar gas and N$_2$ gas) flow rate (Compare ■ indicating AR and N$_2$ flow rates of 100 sccm, 500 sccm and 1000 sccm in FIG. 2)

Figure 3A:
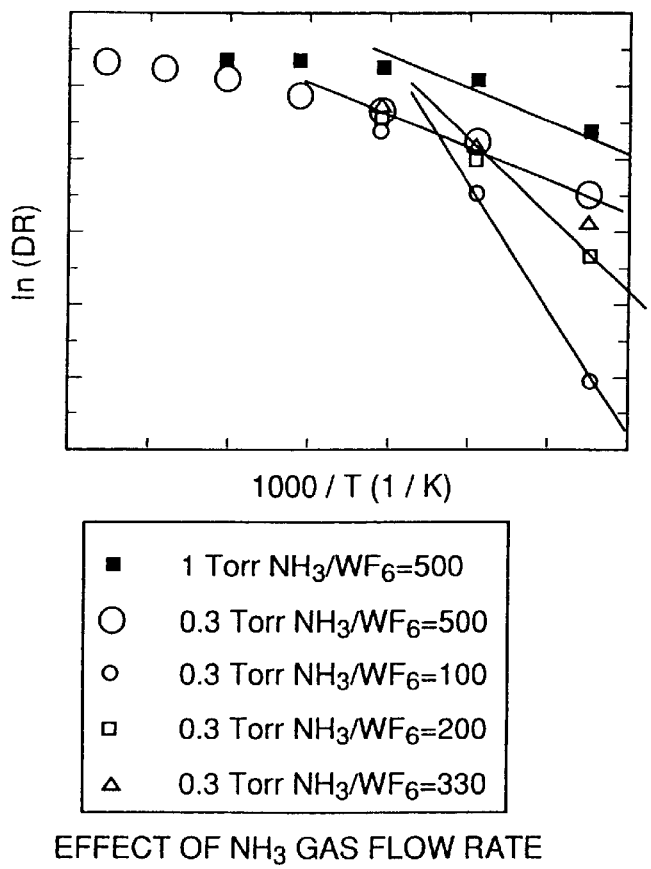
FIGS. 3($a$) and 3($b$) are graphs of Arrhenius plots showing the effect of the flow rate of $NH_3$ gas and the effect of $NH_3/WF_6$ flowrate ratio, respectively, on forming a tungsten nitride film.
Figure 3B:
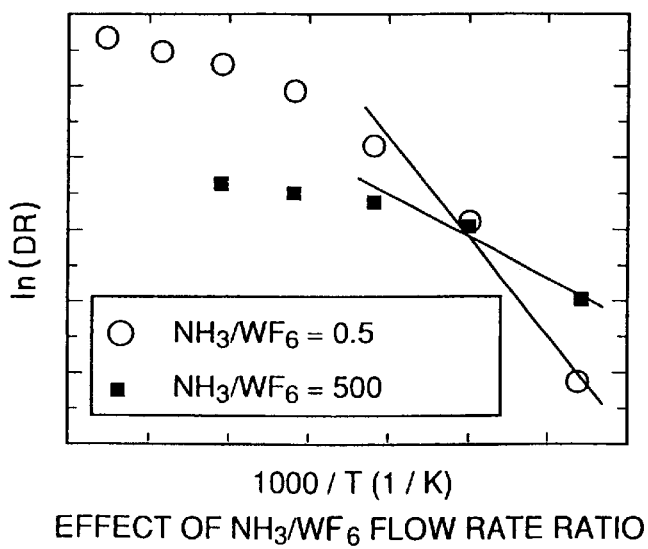
Figure 4A:
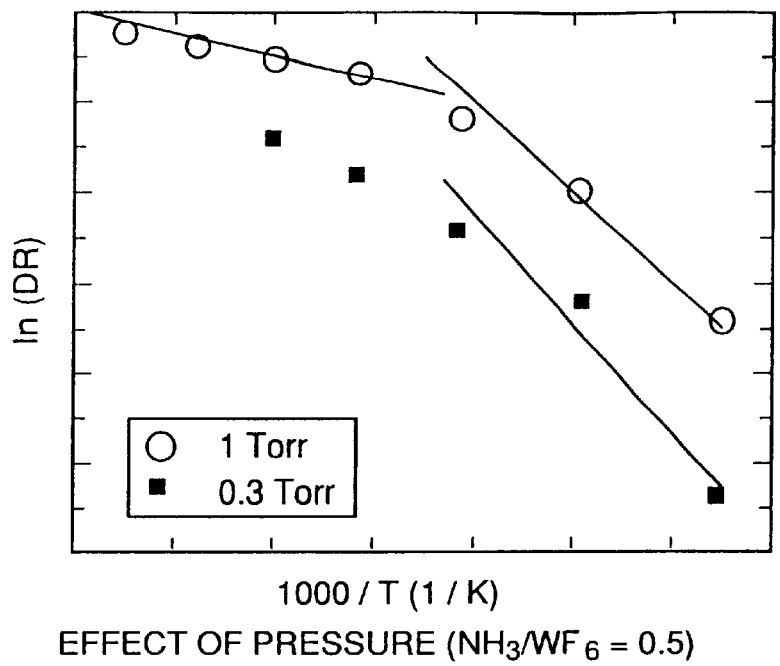
FIGS. 4($a$) and 4($b$) are graphs of Arrhenius plots showing the effect of pressure on forming a film.
Figure 4B:
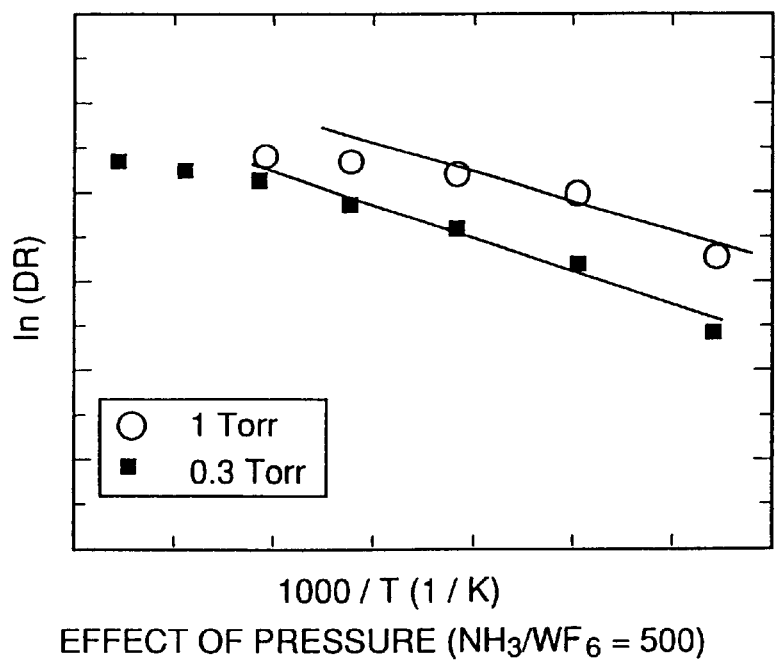
Figure 5A:
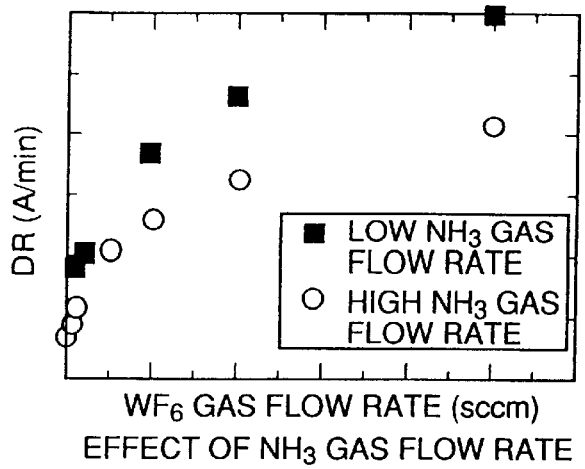
FIGS. 5($a$), 5($b$) and 5($c$) are graphs of saturation curves showing the effect of the flow rate of $NH_3$ gas, the effect of pressure and the effect of the flow rate of a carrier gas (Ar, $N_2$), respectively, on forming a tungsten nitride film.
Figure 5B:
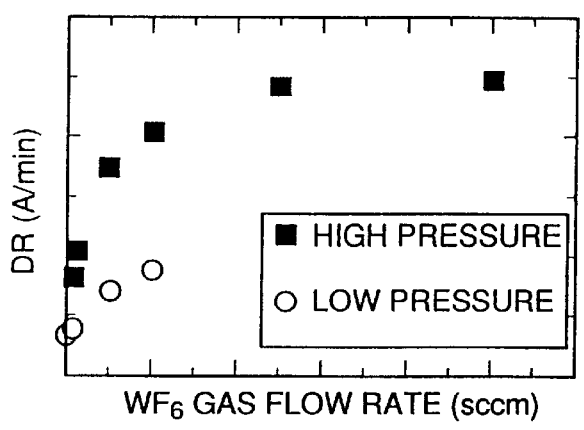
Figure 5C:
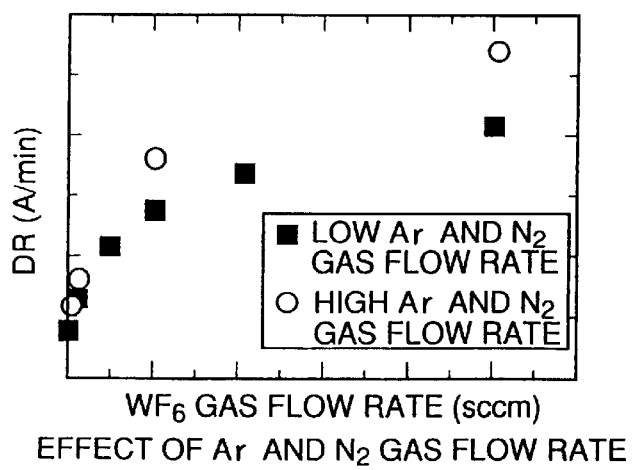

The desirable conditions (1) to (5) for forming films having satisfactory coverage (step coverage) can be also known from Arrhenius plots shown in FIGS. 3(a), 3(b), 4(a) and 4(b) and saturation curves shown in FIGS. 5(a), 5(b) and 5(c). Peel resistance can be measured by tape tests.

Thus, film forming characteristics can be known from the Arrhenius plots and the saturation curves. It is known from the Arrchenius plots whether the film forming conditions are in the range of source gas supply rate determination or in the range of source gas reaction rate determination, It is generally known that films excellent in coverage (step coverage) can be formed when the film forming conditions are in the range of reaction rate determination.

The relation between the source gas, such as WF$_6$ gas, and film deposition rate can be known from the saturation curves. Supposing that the WF$_6$ gas concentration of the source gas in a hole decreases with the depth of the hole, a film satisfactory in coverage (step coverage) can be formed when the film forming conditions lie in such a range of the saturation curves that the film deposition rate remains constant regardless of the variation of WF$_6$ gas flow rate.

Dependence of coverage (step coverage) on temperature of water is explaned as below.

The Arrhenius plots shown in FIGS. 3(a), 3(b) and 4(a) and 4(b) were obtained by varying the NH$_3$ gas flow rate, the NH$_3$/WF$_6$ flow rate ratio and the pressure in the film forming chamber as the parameters of the semiconductor device fabricating method of the present invention. It is known from these Arrhenius plots that the plot inclination decreases and transition toward the supply rate determination occurs with the increase of the temperature of the semiconductor wafer. Consequently, films satisfactory in coverage (step coverage) can be formed when the temperature of the semiconductor wafer is in a low temperature range.

Dependence of coverage (step coverage) on NH$_3$ gas flow rate is explained as below.

It is known from the Arrhenius plots of FIG. 3(a) comparatively showing the effects of NH$_3$ gas flow rates that the plot inclination decreases and transition toward the supply rate determination occurs from low temperature with the increase of the NH$_3$ gas flow rate; that is, films satisfactory in coverage (step coverage) can be formed when the NH$_3$ gas flow rate is low. It is known from the saturation curves shown in FIG. 5(a) that the lower is the NH$_3$ gas flow rate, the lower becomes the rate of change of film deposition rate with the change of WF$_6$ gas flow rate at low WF$_6$ gas flowrate region.

Dependence of coverage (step coverage) on NH$_3$/WF$_6$ flow rate ratio is explained below.

It is known from the Arrhenius plots of FIG. 3(b) comparatively showing the effects of NH$_3$/WF$_6$ flow rate ratios that the plot inclination decreases and transition toward the supply rate determination occurs at a lower temperature with the increase of the NH$_3$/WF$_6$ flow rate ratio. It is known that films satisfactory in coverage (step coverage) can be formed when the NH$_3$/WF$_6$ flow ratio is small.

Dependence of coverage (step coverage) on pressure in film forming chamber is explained as below.

It is known from FIGS. 4(a) and 4(b) comparatively showing the effects of pressures in the film forming chamber that the higher being the pressure in the film forming chamber, the smaller becomes the plot inclination or the lower becomes the temperature at which transition toward the supply rate determination occurs. Therefore, it is known that film satisfactory in coverage (step coverage) can be formed when the pressure in the film forming chamber is in a low pressure range. It is known from the saturation curves shown in FIG. 5(b) that the lower being the pressure in the film forming chamber, the smaller is the rate of change of film deposition rate with the change of $WF_6$ gas flow rate, which corroborates film forming conditions for forming films satisfactory in coverage (step coverage).

Dependence of coverage (step coverage) on carrier gas flow rate i.e. AR gas flow rate and $N_2$ gas flow rate, is explained below.

The dependence of coverage (step coverage) on carrier gas flow rates, cannot be known from the Arrhenius plots, but the same can be known from the saturation curves shown in FIG. 5(c). As shown in FIG. 5, the rate of change of film deposition rate with the change of $WF_6$ gas flow rate is smaller when both Ar gas flow rate and $N_2$ gas flow rate are low, from which it is known that films satisfactory in coverage (step coverage) can be formed when both the Ar gas flow rate and the $N_2$ gas flow rate are low.

Tables 3 and 4 show results of tape tests for the adhesion of lower electrodes as deposited and those of tape tests for the adhesion of lower electrodes as annealed, respectively. It is known from Tables 3 and 4 that film forming conditions for forming films satisfactory in adhesion include (1) high film forming temperature, (ii) large $NH_3/WF_6$ flow rate ratio, (iii) high $NH_3$ flow rate and (iv) high pressure in the film forming chamber, high Ar gas flow rate and high $N_2$ gas flow rate. In a section for wafer temperature in Table 3, "P" signifies that the film was pooled off, "NP" signifies that the film was not peeled off and values indicates film thickness in angstrom.

TABLE 3

| Sample No. | Film forming pressure (torr) | $WF_6/NH_3/Ar/N_2$ (sccm) | Tape test Wafer temperature (° C.) | | | | | | |
|---|---|---|---|---|---|---|---|---|---|
| | | | 300 | 350 | 400 | 450 | 500 | 550 | 600 |
| 11 | 0.3 | 1/500/100/100 | | NP/798 | NP/1083 | | | NP/1818 | |
| 12 | 0.3 | 100/50/100/100 | NP/307 | P/632 | P/1103 | P/1824 | P/2494 | | |
| 13 | 1 | 1/500/100/100 | NP/867 | NP/1502 | NP/1799 | | | | |
| 14 | 1 | 100/50/100/100 | | P/1532 | P/2928 | P/4022 | NP/5812 | NP/6465 | |
| 15 | 3 | 2/200/100/100 | | | NP/2355 | | | NP/2983 | |
| 16 | 0.3 | 1/100/100/100 | NP/283 | NP/529 | NP/892 | | | | |
| 17 | 0.3 | 1/200/100/100 | NP/377 | | | | | | |
| 18 | 0.3 | 1/300/100/100 | NP/438 | | | | | | |
| 19 | 0.3 | 10/10/100/100 | | | P/462 | | | | |
| 20 | 0.3 | 10/50/100/100 | | | NP/1065 | | | | |
| 21 | 0.3 | 0.1/500/2000/2000 | | | NP/1114 | | | | |
| 22 | 0.3 | 50/500/2000/2000 | | | NP/4247 | | | | |

TABLE 4

Effect of annealing (600° C., 300 min, $N_2$ atmosphere)

| Sample No. | temperature (° C.) | Film forming pressure (torr) | $WF_6/NH_3/Ar/N_2$ (sccm) | Film thickness (Å) | Peeling |
|---|---|---|---|---|---|
| 31 | 450 | 1 | 1/500/100/100 | 1921 | Not peeled |
| 32 | 600 | 1 | 1/500/100/100 | 2075 | Not peeled |
| 33 | 400 | 0.3 | 1/500/2000/2000 | 1407 | 15 mm diameter central portion peeled off |
| 34 | 400 | 0.3 | 10/500/2000/2000 | 2544 | Peeled (excluding 7 mm wide peripheral portion) |
| 35 | 350 | 0.3 | 1/200/100/100 | 696 | Peeled (excluding 5 mm wide peripheral portion) |
| 36 | 350 | 0.3 | 1/300/100/100 | 801 | Peeled (excluding 3 mm wide peripheral portion) |
| 37 | 400 | 0.3 | 1/100/100/100 | 892 | Peeled (excluding 12 mm wide peripheral portion) |
| 38 | 400 | 0.3 | 1/300/100/100 | 1191 | Peeled (excluding 15 mm wide peripheral portion) |
| 39 | 400 | 0.3 | 1/500/100/100 | 1171 | Portions of $WN_x$ film under $WF_6$ gas hole at the shower head in central region peeled off |
| 40 | 400 | 0.3 | 10/500/100/100 | 2289 | Totally peeled off |
| 41 | 400 | 0.3 | 20/500/100/100 | 2708 | Totally peeled off |
| 42 | 450 | 0.3 | 1/500/100/100 | 1308 | 100 mm diameter central portion peeled slightly |
| 43 | 500 | 0.3 | 1/500/100/100 | 1637 | Not peeled |

Figure 6A:
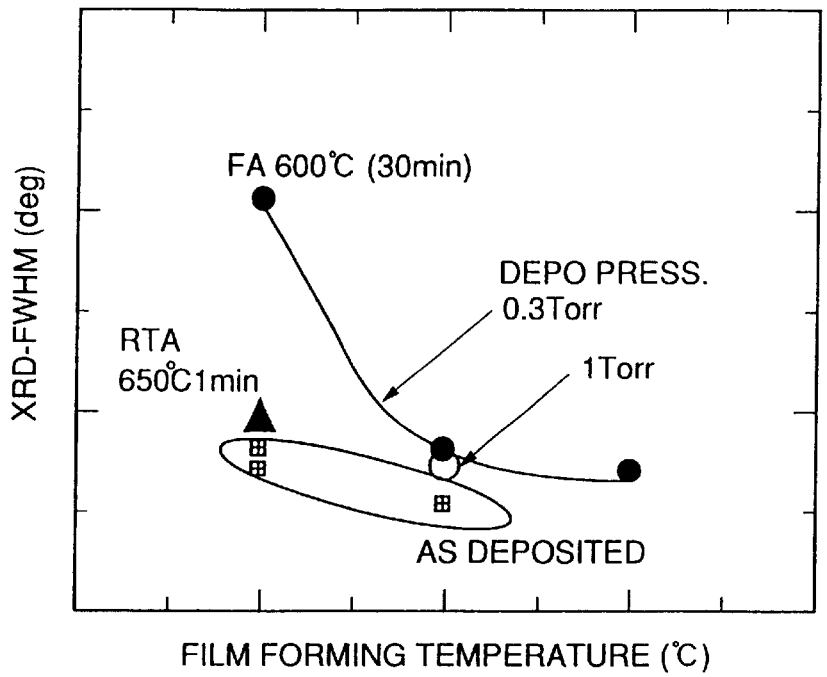
FIGS. 6($a$) and 6($b$) are graphs showing the relation between the crystallinity of a tungsten nitride film and film forming temperature, and the relation between N/W ratio and film forming temperature, respectively.
Figure 6B:
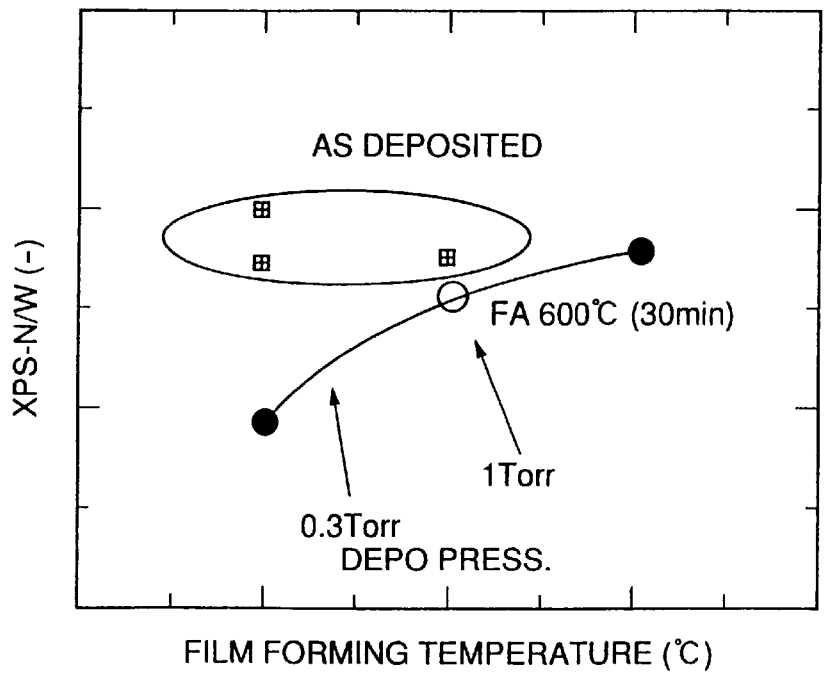

Satisfactory adhesion can be explained from the crystallinity of the $WN_x$ film and the N/W composition ratio, i.e., the ratio of the number of N atoms to that of W atoms. As shown in FIG. 6, the FWHM of the (111) plane of W2N of the $WN_6$ film measured by XRD is increased by annealing, and the N/W composition ratio of the $WN_x$ film measured by XPS is reduced. The lower being the film forming temperature in forming the $WN_x$ film, the greater is the rate of the change, that is, the greater is the FWHM of the $WN_x$ film as deposited. It can be inferred from a series of foregoing facts that nitrogen atoms are ejected from the $WN_x$ film by annealing to deteriorate the crysallinity of the $WN_x$ film, and the $WN_x$ film peels off when the crystallinity thereof is deteriorated excessively, and that the deterioration of crystallinity is significant in $WN_x$ films having originally inferior crystallinity owing to a low film forming temperature.

EXAMPLE 7

Semiconductor device fabricating methods in Examples 7-1 to 7-8 specified by different film forming conditions were carried out to form $WN_x$ films to determine film forming conditions suitable for forming a $WN_x$ film for use as the lower electrode of a capacitor of metal/insulator/metal construction, capable of suppressing leakage current.

EXAMPLE 7-1

A semiconductor device fabricating method in Example 7-1 was carried out the same as in Example 6-2, except that $SiH_4$ gas (silane gas) was supplied at 20 sccm during the $WN_x$ film forming process, and Ar gas, $N_2$ gas and $SiH_4$ gas were supplied at 100, 100, and 20 sccm for 60 s for postflowing after the $WN_x$ film had been formed. The film formed by Example 7-1 was substantially equal to that formed by Example 6-2 in coverage (step coverage), adhesion and oxide-equivalent effective film thickness determined by electrical measurement. The film was superior in leakage current suppression to the film formed by Example 6-2. Voltage that caused a leakage current density of $1 \times 10^{-8}$ $A/cm^2$ was ±0.9 V. It was found from the comparative examination of current-voltage curves, not shown, obtained through leakage current measurement that the film has a wider voltage range in which the leakage current does not increase even if the voltage is raised than that of the film formed by Example 6-2, which proved that a sufficiently effective Schottky barrier was formed in the $Ta_2O_5/WN_x$ interface. Electric field strength was increased from 5.38 MV/cm to 5.94 MV/cm ($\theta 1 \times 10^{-8}$ $A/cm^2$).

EXAMPLE 7-2

A semiconductor device fabricating method in Example 7-2 was carried out the same as in Example 6-2, except that $NH_3$ gas was supplied at 500 sccm after the $WN_x$ film had been formed, and the surface of the $WN_x$ film was exposed to an $NH_3$ plasma of 400 W for 120 s to nitride the surface of the formed $WN_x$ film before forming a $Ta_2O_5$ film. The film thus formed was substantially equal to that formed by Example 6-2 in coverage (step coverage), adhesion and oxide-equivalent effective film thickness determined by electrical measurement. The film formed by Example 7-2 was superior in leakage current suppression to the film formed by Example 6-2. Voltage that caused a leakage current density of $1 \times 10^{-8}$ $A/cm^2$ was ±0.9 V. It was found from the comparative examination of current-voltage curves, not shown, obtained through leakage current measurement that the film has a wider voltage range in which the leakage current does not increase even if the voltage is raised, than that of the film formed by Example 6-2, which proved that a sufficiently effective Schottky barrier was formed in the $Ta_2O_5/WN_x$ interface.

EXAMPLE 7-3

A semiconductor device fabricating method in Example 7-3 was carried out the same as in Example 6-2, except that the formed $WN_x$ film was subjected to a RTN process (rapid thermal nitridation process) at 800° C. for 60 s in an $NH_3$ gas atmosphere to increase the nitrogen contents of a surface layer of the $WN_x$ film before forming the $Ta_2O_5$ film. The film was sustantially equal to that formed by Example 6-2 in coverage (step coverage), adhesion and oxide-equivalent effective film thickness determined by electrical measurement. The film was superior in leakage current suppression to the film formed by Example 6-2. Voltage that caused a leakage current density of $1 \times 10^{-8}$ $A/cm^2$ was ±0.9 V. It was found from the comparative examination of current-voltage curves, not shown, obtained through leakage current measurement that the film has a wider voltage range in which leakage current does not increase even if voltage is raised than that of the film formed by Example 6-2, which proved that a sufficiently effective Schottky barrier was formed in the $Ta_2O_5/WN_x$ interface.

EXAMPLE 7-4

A semiconductor device fabricating method in Example 7-4 was carried out the same as in Example 7-1, except that the formed $WN_x$ film was subjected to a RTO process (rapid thermal oxidation process) at 520° C. for 60 s in a $N_2$ gas atmosphere having an oxygen gas concentration of 5% to form a thin $SiO_2$ layer in the surface layer of the $WN_x$ film before forming the $Ta_2O_5$ film. The film formed by Example 7-1 was substantially equal to that formed by Example 7-1 in coverage (step coverage) and adhesion. Although the film formed by Example 7-4 had an oxide-equivalent effective film thickness slightly greater than that of the film formed by Example 7-1, the film formed by Example 7-4 had an improved leakage current suppressing ability. Voltage that caused a leakage current density of $1 \times 10^8$ $A/cm^2$ was ±0.9 V. It was found from the comparative examination of current voltage curves, not shown, obtained through leakage current measurement that the film has a wider voltage range in which leakage current does not increase even if voltage is raised than that of the film formed by Example 6-2, which proved that a sufficiently effective Schottky barrier was formed in the $Ta_2O_5/WN_x$ interface. Electric field strength was as high as 5.87 MV/cm (@$1 \times 10^8$ $A/cm^2$).

EXAMPLE 7-5

A semiconductor device fabricating method in Example 7-5 was carried out the same as in Example 6-2, except that $NH_3$ gas, Ar gas, $N_2$ gas and $SiH_4$ gas were supplied at 500, 100, 100 and 20 sccm, respectively, for 60 s for postflowing after a $WN_x$ film had been formed. The film formed by Example 7-5 was substantially equal to that formed by Example 6-2 in coverage (step coverage), adhesion and oxide-equivalent effective film thickness determined by electrical measurement. The film had an improved leakage current suppressing ability. Voltage that caused a leakage current density of $1 \times 10^8$ $A/cm^2$ was ±0.9 V. It was found from the comparative examination of current-voltage curves, not shown, obtained through leakage current measurement that the film has a wider voltage range in which leakage current does not increase even if voltage is raised than that of the film formed by Example 6-2, which proved that a sufficiently effective Schottky barrier was formed in the $Ta_2O_5/WN_x$ interface.

EXAMPLE 7-6

A semiconductor device fabricating method in Example 7-6 was carried out the same as in Example 6-2, except that $WF_6$ gas, Ar gas, $N_2$ gas and $SiH_4$ gas were supplied at 1, 100, 100 and 20 sccm, respectively, for 60 s for postflowing after a $WN_x$ film had been formed. The film thus formed by Example 7-6 was substantially equal to that formed by Example 6-2 in coverage (step coverage), adhesion and oxide-equivalent effective film thickness determined by electrical measurement. The film had an improved leakage current suppressing ability. Voltage that caused a leakage current density of $1 \times 10^{-8}$ A/cm$^2$ was ±0.9 V. It was found from the comparative examination of current-voltage curves, not shown, obtained through leakage current measurement that the film has a wider voltage range in which leakage current does not increase even if voltage is raised that of the film formed by Example 6-2, which proved that a sufficiently effective Schottky barrier was formed in the $Ta_2O_5/WN_x$ interface.

EXAMPLE 7-7

A semiconductor device fabricating method in Example7-7 was carried out the same as in Example 7-6, except that a surface of the electrode of $WN_x$ containing Si was oxidized by RTO at 520° C. for 60 s in a $N_2$ gas atmosphere having an oxygen gas concentration of 5% before forming a $Ta_2O_5$ film. The film formed by Example 7-7 was substantially equal to that formed by Example 7-6 in coverage (step coverage) and adhesion. Although the film formed by Example 7-7 had a slightly increased oxide-equivalent effective film thickness, the film formed by Example 7-7 had an improved leakage current suppressing ability. Voltage that caused a leakage current density of $1 \times 10^{-8}$ A/cm$^2$ was ±0.9 V. It was found from the comparative examination of current-voltage curves, not shown, obtained through leakage current measurement that the film has a wider voltage range in which leakage current does not increase even if voltage is raised than that of the film formed by Example 6-2, which proved that a sufficiently effective Schottky barrier was formed in the $Ta_2O_5/WN_x$ interface. Improved electric field strength was as high as 5.88 MV/cm (@$1 \times 10^{-8}$ A/cm$^2$).

EXAMPLE 7-8

A semiconductor device fabricating method in Example 7-8 was carried out the same as in Example 7-6, except that a surface of the $WN_x$ film was nitrided by supplying $NH_3$ gas at 500 sccm into the film forming chamber and exposing the surface of the $WN_x$ film to an $NH_3$ plasma of 400 W for 120 before forming a $Ta_2O_5$ film. The film formed by Example 7-8 was substantially equal to that formed by Example 7-6 in coverage (step coverage), adhesion and oxide-equivalent effective film thickness determined by electrical measurement. The film had an improved leakage current suppressing ability. Voltage that caused a leakage current density of $1 \times 10^{-8}$ A/cm$^2$ was ±1.0 V. It was found from the comparative examination of current-voltage curves, not shown, obtained through leakage current measurement that the film has a wider voltage range in which leakage current does not increase even if voltage is raised than that of the film formed by Example 6-2, which proved that a sufficiently effective Schottky barrier was formed in the $Ta_2O_5/WN_x$ interface.

It was found from the results of film forming experiments using Examples 7-1 to 7-8 that the voltage range, in which the leakage current density is below a predetermined level, can be expanded and a satisfactory Schottky barrier can be formed by executing the following processes when forming the $WN_x$ film or after forming the $WN_x$ film by using, for example, the process conditions specifying Example 6-2.

(1) Addition of $SiH_4$ gas to the source gases when forming the $WN_x$ film or performance of postflowing using a gas containing $SiH_4$ gas The gas containing $SiH_4$ gas is, for example, a mixed gas of $SiH_4$ and $WF_6$ gas or a mixed gas of $SiH_4$ gas and $NH_3$ gas.

(2) Nitridation of the surface of the $WN_x$ film (3) Addition of $SiH_4$ gas to the source gas, or performance of postflowing using a gas containing $SiH_4$ gas and oxidation of the surface of the $WN_x$ film after the postflowing (4) Addition of $SiH_4$ gas to the source gas, or performance of postflowing using a gas containing $SiH_4$ gas and nitridation of the surface of the $WN_4$ film after the postflowing $NH_3$ gas is supplied first, and then $SiH_4$ gas is supplied so as to reduce particles when both the $NH_3$ gas and the $SiH_4$ gas are supplied. It is desirable, when stopping the supply of the gases, that the supply of $SiH_4$ gas is stopped first and then $SiH_4$ gas is purged completely from the film forming chamber by $NH_3$ gas.

It was also found that it is effective to form a laminated constitution by laminating a film to the $WN_x$ film to achieve a satisfactory Schottky barrier.

A layered $WSi/WN_x$ film formed by superposing WSi film on $WN_x$ film is explained as below.

When a $WN_x$ film is coated with a WSi film (tungsten silicide film), nitrogen atoms are not expelled from the $WN_x$ film when the $WN_x$ film is subjected to a high-temperature heat treatment, such as annealing. Consequently, the volume of the $WN_x$ film is not reduced, stress is not induced in the $WN_x$ film and the $WN_x$ film may not peel off. The quality of the layered $WSi/WN_x$ film can be improved by the following processes.

(1) Nitridation of the surface of the layered $WSi/WN_x$ film by an annealing process using a $NH_3$ atmosphere or by a plasma nitridation process using an $N_2$ plasma or an $NH_3$ plasma (2) Oxidation of the surface of the layered $WSi/WN_x$ film by an annealing process using an oxidizing atmosphere or by a plasma oxidation process using a plasma of an oxidizing gas A surface layer having a high nitrogen content or a surface oxide layer formed in the surface of the $WN_x$ film by the process of (1) or (2), is useful for forming a satisfactory Schottky barrier between the $WN_x$ film and the $Ta_2O_5$ film, and enhances heat resistance and oxidation resistance of the $WN_x$ film which are important to withstand a thermal load applied to the $WN_x$ film by a subsequent thermal process.

A layered $SiN/WN_x$ film formed by superposing SiN film on $WN_x$ film is explained as below.

When a $WN_x$ film is coated with a SiN film (silicon nitride film), nitrogen atoms are not expelled from the $WN_x$ film when the $WN_x$ film is subjected to a high-temperature heat treatment, such as annealing. Consequently, the volume of the $WN_x$ film is not reduced, stress is not induced in the $WN_x$ film and the $WN_x$ film may not peel off. The $WN_x$ film or the layered film formed by combining the $WN_x$ film with another film described above is useful not only for forming the upper electrode and the lower electrode of a capacitor but also for forming other wiring lines or barrier layer, for example, the barrier layer inserted between lower electrode and storage node contact to prevent oxidization of the surface of this storage node contact made by poly Si or tungsten.

EXAMPLE 8

Semiconductor device fabricating methods in Examples 8-1 and 8-2 specified by different film forming conditions were carried out to form $WN_x$ films to determine film forming conditions suitable for forming a $WN_x$ film for use as the upper electrode of a capacitor of metal/insulator/metal construction or metal/insulator/semiconductor construction.

EXAMPLE 8-1

A $WN_x$ film having a flat portion of about 200 Å in thickness was formed by using the following process conditions. The $WN_x$ film is intended to be used as the upper electrode of a capacitor cell of 0.3 $\mu$m in diameter and 0.6 $\mu$m in depth employing a 100 Å thick $Ta_2O_5$ film as a capacitor insulting film. The coverage and the electrical characteristics of the $WN_x$ film were evaluated on the basis of the condition of sections of the $WN_x$ film observed by a SEM, the oxide-equivalent film thickness and the leakage current density. The adhesion of the $WN_x$ film as deposited and that of the $WN_x$ film after a heat resistance testing process i.e. a RTA process that heats the $WN_x$ film at 650° C. for 60 s in a $N_2$ gas atmosphere, were evaluated on the basis of results of tape tests. The bottom coverage (step coverage) of the $WN_x$ film after approximately 100%. Both the $WN_x$ film as deposited and the $WN_x$ film after heat-treated were not peel off. The oxide-equivalent effective film thickness $T_{eff}$ was 1.2 nm, and the voltage that caused a leakage current density of $1\times10^{-5}$ A/cm² was ±0.9 V.

[Surface Treatment Process]
(1) Conditions for Semiconductor Device Fabricating System
 (i) Pressure in chamber: 1 torr
 (ii) Surface temperature of wafer: 400° C.
(2) Source Gases
 $WF_6/NH_3/Ar/N_2$ flow rates: 50/0/500/500 sccm
 Ar gas and $N_2$ gas were used as carrier gases for the $WF_6$ gas line and the $NH_3$ gas line, respectively.
 Processing time: 60 s
[Film Forming Process]
(1) Conditions for Semiconductor Device Fabricating System
 The same as for the surface treatment process
(2) Source Gases
 $WF_6/NH_3/Ar/N_2$ flow rates: 50/500/500/500 sccm

EXAMPLE 8-2

A semiconductor device fabricating method in Example 8-2 was carried out the same as in Example 8-1 to form a 200 Å thick $WN_x$ film, except that the surface treatment process was omitted and film forming conditions shown below were used. The bottom coverage (step coverage) of the $WN_x$ film was approximately 100%. Both the $WN_x$ film as deposited and the $WN_x$ film after heat-treated were not peel off. The oxide-equivalent effective film thickness $T_{eff}$ was 1.2 nm, and the voltage that caused a leakage current density of $1\times10^{-8}$ A/cm² was ±0.85 V.
[Film Forming Process]
(1) Conditions for Semiconductor Device Fabricatin System
 (i) Pressure in chamber: 1 torr
 (ii) Surface temperature of wafer: 450° C.
(2) Source Gases
 (i) First step:
  $WF_6/NH_3/Ar/N_2$ flow rates: 0/500/500/500 sccm
  Processing time: 60 s
 (ii) Second step:
  $WF_6/NH_3/Ar/N_2$ flow rates: 50/500/500/500 sccm
 Ar gas and $N_2$ gas were used as carrier gases for the $WF_6$ gas line and the $NH_3$ gas line, respectively.

COMPARATIVE EXAMPLE 8-1

A semiconductor device fabricating method in Comparative example 8-1 was carried out the same as in Example 8-2, except that the wafer temperature in the film forming process was raised to 550° C. A $WN_x$ film thus formed has adhesion substantially equal to that of the $WN_x$ film formed by Example 8-2, but a bottom coverage (step coverage) reduced to 30%. The $WN_x$ film formed by Comparative example 8-1 caused a large leakage current density of $1\times10^{-5}$ A/cm² at −0.7 V.

COMPARATIVE EXAMPLE 8-2

A semiconductor device fabricating method in Comparative example 8-2 was carried out the same as in Example 8-2, except that the flow rate of $NH_3$ gas was raised to 1000 sccm. A $WN_x$ film thus formed had adhesion substantially equal to that of the $WN_x$ film formed by Example 8-2, but a bottom coverage (step coverage) reduced to 60%. The $WN_x$ film formed by Comparative example 8-2 caused a large leakage current density of $1\times10^{-5}$ A/cm² at −0.7 V.

It is known from the results of examination of the $WN_x$ films formed by Examples 8-1 and 8-2 and Comparative example 8-1 and 8-2 that film forming conditions for forming a $WN_x$ film for use as the upper electrode of a capacitor include the following conditions (1) to (3) in view of forming the $WN_x$ film satisfactory in coverage (step coverage), adhesion and electrical characteristics.

(1) Preferably, the temperature of the semiconductor wafer is not higher than 550° C., more preferably, in the range of 400 to 500° C.
(2) Preferably, the $NH_3/WF_6$ flow rate ratio is not greater than about 20, more preferably, in the range of about 2 to 10.
(3) Preferably, the $WF_6$ gas concentration of the mixed source gas is greater than about 1.0% by volume, more preferably, in the range of about 2 to 20% by volume.

It was found that the adhesion and the electrical characteristics of the $WN_x$ film as deposited can be improved by subjecting the $WN_x$ film to a proper annealing process using a high temperature. The effects of the annealing process are:
(1) Reduction of the resistivity of the $WN_x$ film
(2) Stabilization of the film quality of the $WN_x$ film and Enhancement of resistance against deformation or pooling in a high-temperature thermal process
(3) Reduction of the F content of the $WN_x$ film As regards the effect of (1), a resistivity of 4000 $\mu\Omega$-m of an about 700 Å thick $WN_x$ film as deposited was reduced to 1700 $\mu\Omega$-m when the $WN_x$ film was annealed at 650° C. for 60 s in a $N_2$ gas atmosphere and was reduced to 15 $\mu\Omega$-m when the same was annealed at 900° C. for 600 s in a $N_2$ gas atmosphere.

As regards the effect of (2), since the deformation of the $WN_x$ film is unavoidable to some extent due to removal of nitrogen atoms from the $WN_x$ film by annealing, the $WN_x$ film is heat-treated beforehand to moderate damage that may be caused to the $WN_x$ film by a high-temperature thermal process. For example, (i) the $WN_x$ film is heat-treated at a temperature which is 80% or below of the temperature at which the $WN_x$ film is treated in the high-temperature thermal process, (ii) the $WN_x$ film is heat-treated during the time which is 50% or below of the time during which the $WN_x$ film is treated in the high-temperature thermal process, (iii) the $WN_x$ film is heat-treated beforehand, when a film in which high stress may be induced, such as a W film, is to be formed on the $WN_x$ film, at the same temperature as in the subsequent high-temperature thermal process to which the $WN_x$ film will be subjected after the W film or the like has been formed thereon or (iv) the $WN_x$ film is heat-treated beforehand, when a highly brittle film, such as a $Ta_2O_5$ film, is to be formed on the $WN_x$ film, at a temperature higher by about 50° C. than the same temperature as in the subsequent high-temperature thermal process to which the $WN_x$ film will be subjected after the $Ta_2O_5$ film or the like has been formed thereon to prevent the deformation of the $WN_x$ film when the $WN_x$ film is subjected to the high-temperature thermal process in order to stabilize the film quality of the $WN_x$ film.

It was found that the quality of the $WN_x$ film can be improved by carrying out the following processes during or after the formation of the $WN_x$ film when forming the $WN_x$ film for use as the upper electrode of a capacitor or a part of the upper electrode of a capacitor, similarly to the application of the $WN_x$ film formed by Example 7 to the lower electrode of a capacitor.

(1) $SiH_4$ gas is added to the mixed source gas when forming the $WN_x$ film, or the $WN_x$ film is subjected to postflowing using a gas containing $SiH_4$ gas.

(2) The surface of the $WN_x$ film is nitrided.

(3) $SiH_4$ gas is added to the mixed source gas when forming the $WN_4$ film, or the $WN_x$ film is subjected to postflowing using a gas containing $SiH_4$ gas and the surface of the $WN_x$ film is oxidized after postflowing.

(4) $SiH_4$ gas is added to the mixed source gas when forming the $WN_x$ film, or the $WN_x$ film is subjected to postflowing using a gas containing $SiH_4$ gas and the surface of the $WN_x$ film is nitrided after postflowing.

Although Example 8 described above employs $SiH_4$ gas as a gas containing silicon atoms, $Si_2H_6$ gas (disilane gas) or $SiH_2Cl_2$ gas (dichlorosilane gas) may be used instead of $SiH_4$ gas.

EXAMPLE 9

Semiconductor device fabricating methods in Examples 9-1 to 9-4 specified by different film forming conditions were carried out to determine film forming conditions suitable for forming a $WN_x$ film for use as a copper diffusion barrier film.

EXAMPLE 9-1

A semiconductor wafer having a surface coated with an oxide film provided with holes of 0.25 μm in diameter and 2 μm in depth was mounted on the susceptor disposed in the film forming chamber, and a $WN_x$ film having a 200 Å thick portion extending over the flat portion of the oxide film was formed on the oxide film by using film forming conditions shown below. Sections of the $WN_x$/oxide film were observed by using a SEM to evaluate the coverage (step coverage) of the $WN_x$ film. A semiconductor wafer having a surface coated with a layer insulating film formed by decomposing TEOS by a plasma CVD process was mounted on the susceptor disposed in the film forming chamber, an about 200 Å thick $WN_4$ film was formed on the layer insulating film by using film forming conditions shown below, and then an about 1000 Å thick Cu film was formed on the $WN_x$ film by a CVD process. The adhesion between the Cu film and the $WN_x$ film was evaluated by tape tests. A silicon wafer having a surface not oxidized was mounted on the susceptor disposed in the film forming chamber, an about 200 Å thick $WN_x$ film was formed thereon by using film forming conditions shown below, and then an about 1000 Å thick Cu film was formed on the $WN_x$ film by a CVD process. The semiconductor wafer coated with the $WN_x$ film and the Cu film was annealed at 600° C. for 60 min in a $N_2$ gas atmosphere. The generation of Si pits and reaction at the $WN_x$/Si interface was examined through the observation of sections of the $WN_x$/Si film by using a SEM. The ability of the $WN_x$ film as a barrier was evaluated through the measurement of the profile by the SIMS technique. The bottom coverage (step coverage) was about 80%. The $WN_x$ film did not peel off and has sufficiently high adhesion. Any pits were not found. The measurement of the profile of the Cu film by the SIMS technique showed that there was no diffusion of Cu into silicon, which proved the sufficient ability of the $WN_x$ film as a barrier.

[Film Forming Process]

(1) Conditions for Semiconductor Device Fabricating System
   (i) Pressure in chamber: 3 torr
   (ii) Surface temperature of wafer: 450° C.

(2) Source Gases
   (i) First step:
      $WF_6/NH_3/SiH_4/Ar/N_2$ flow rates: 2/200/5/100/100 sccm
   (ii) Second step (Postflowing):
      $SiH_4/Ar/N_2$ flow rates: 5/100/100 sccm
      Processing time: 60 s
   Ar gas and $N_2$ gas were used as carrier gases for the $WF_6$ gas line and the $NH_3$ gas line, respectively.

EXAMPLE 9-2

A semiconductor device fabricating method in Example 9-2 was carried out the same as in Example 9-1, except that following film forming conditions were used to form a $WN_x$ film. The coverage (step coverage), adhesion and ability as a barrier of the $WN_x$ film were evaluated. The bottom coverage (step coverage) was about 80%. The $WN_x$ film did not peel off and had sufficiently high adhesion. Any pits were not found. The measurement of the profile of the Cu film by the SIMS technique showed that there was no diffusion of Cu into silicon, which proved the sufficient ability of the $WN_x$ film as a barrier.

[Film Forming Process]

(1) Conditions for Semiconductor Device Fabricating System
   (i) Pressure in chamber: 3 torr
   (ii) Surface temperature of water: 450° C.

(2) Source Gases
   (i) First steps:
      $WF_6/NH_3/SiH_4/Ar/N_2$ flow rates: 2/200/5/100/100 sccm
      Thickness of $WN_x$: About 200 Å
   (ii) Second step (Postflowing):
      $NH_3/Ar/N_2$ flow rates: 200/100/100 sccm
      Processing time: 60 s
   Ar gas and $N_2$ gas were used as carrier gases for the $WF_6$ gas line and the $NH_3$ gas line, respectively.

EXAMPLE 9-3

A semiconductor device fabricating method in Example 9-3 was carried out the same as in Example 9-1, except that the flow rate of SiH$_4$ gas in the first step and the second step for forming a WN$_x$ film was 1 sccm. The WN$_x$ film was substantially equal to that formed by Example 9-1 in coverage (step coverage), adhesion and ability as a barrier.

EXAMPLE 9-4

A semiconductor device fabricating method in Example 9-4 was carried out the same as in Example 9-1, except that the WN$_x$ film was formed by using film forming conditions shown below. The bottom coverage (step coverage) of the WN$_x$ film was about 70%. The WN$_x$ film was substantially equal to that formed by Example 9-1 in adhesion and ability as a barrier. The WN$_x$ film was 320 Å in thickness and 550 $\mu\Omega$-cm in resistivity, which was smaller by one figure than that of the WN$_x$ film formed by Example 9-1. It is considered that the tungsten-rich layer formed in the second step reduced the resistivity.

[Film Forming Process]
(1) Conditions for Semiconductor Device Fabricating System
  (i) Pressure in chamber: 3 torr
  (ii) Surface temperature of wafer: 450° C.
(2) Source Gases
  (i) First step:
    WF$_6$/NH$_3$/Ar/N$_2$/H$_2$/SiH$_4$ flow rates:
    1/500/2000/2000/0/0 sccm
    Processing time: 15 s
  (ii) Second step:
    WF$_6$/NH$_3$/Ar/N$_2$/H$_2$/SiH$_4$ flow rates:
    15/0/200/0/400/4 sccm
    Processing time: 30 s
  (iii) Third step (Postflowing)
    SiH$_4$/Ar/N$_2$ flow rates: 4/200/200 sccm
    Processing time: 60 s

COMPARATIVE EXAMPLE 9-1

A semiconductor device fabricating method in Comparative example 9-1 was carried out the same as in Example 9-1 to form a WN$_x$ film, except that the WN$_x$ film as deposited was exposed to air and then a Cu film was formed on the WN$_x$ film by a CVD process. The coverage (step coverage), adhesion and ability as a barrier of the WN$_x$ film were evaluated by the same methods as in Example 9-1. Although the WN$_x$ film was substantially equal in coverage (step coverage) to the WN$_x$ film formed by Example 9-1, the WN$_x$ film as deposited was peeled off in the tape test, and could not be subjected to a subsequent heat treatment process.

COMPARATIVE EXAMPLE 9-2

A semiconducting device fabricating method in Comparative example 9-2 was carried out the same as in Example 9-1 to form a WN$_x$ film, except that SiH$_4$ gas was supplied at 0 sccm in the first step of the film forming process not to add SiH$_4$ to the WN$_x$ film. The second step used SiH$_4$ gas for postflowing. The coverage (step coverage), adhesion and ability as a barrier of the WN$_x$ film were evaluated by the same methods as in Example 9-1. Although the WN$_x$ film was substantially equal in coverage (step coverage) to the WN$_x$ film formed by Example 9-1, the WN$_x$ film as deposited was peeled off in the tape test. Pits were also formed in the WN$_x$ film. The WN$_x$ film was far inferior in adhesion and ability as a barrier to the WN$_x$ film formed by Example 9-1.

COMPARATIVE EXAMPLE 9-3

A semiconductor device fabricating method in Comparative example 9-3 was carried out the same as in Example 9-1 to form a WN$_x$ film, except that SiH$_x$ gas was supplied at 10 sccm in the first and second steps of the film forming process. The coverage (step coverage), adhesion and ability as a barrier of the WN$_x$ film were evaluated. Although the WN$_x$ film was substantially equal in coverage (step coverage) and adhesion to the WN$_x$ film formed by Example 9-1, but as for barrier property some reaction occurred at the WN$_x$ film was partially broken after annealing.

COMPARATIVE EXAMPLE 9-4

A semiconductor device fabricating method in Comparative example 9-4 was carried out the same as in Example 9-1 to form a WN$_x$ film, except that the pressure in the film forming chamber was adjusted to 0.3 torr in the film forming process. The coverage (step coverage), adhesion and ability as a barrier of the WN$_x$ film were evaluated. Although the WN$_x$ film was substantially equal in coverage (step coverage) and adhesion as deposited to the WN$_x$ film formed by Example 9-1, but as for barrier property some reaction occurred and the WN$_x$ film was partially broken after annealing. The peal resistance of the WN$_x$ film was reduced by annealing.

COMPARATIVE EXAMPLE 9-5

A semiconductor device fabricating method in Comparative example 9-5 was carried out the same as in Example 9-1 to form a WN$_x$ film, except that the WN$_x$ film was formed by using film forming conditions shown below. The coverage (step coverage), adhesion and ability as a barrier of the WN$_x$ film were evaluated. The bottom coverage (step coverage) was about 40%. The WN$_x$ film as deposited was substantially equal in adhesion to the WN$_x$ film formed by Example 9-1. The adhesion and the ability as a barrier of the WN$_x$ film after the heat treatment of the WN$_x$ film could not be evaluated because the heat treatment caused Cu precipitation.

[Film Forming Process]
(1) Conditions for Semiconductor Device Fabricating System
  (i) Pressure in chamber: 3 torr
  (ii) Surface temperature of wafer: 400° C.
(2) Source Gases
  (i) First step:
    WF$_6$/NH$_3$/SiH$_4$/Ar/N$_2$ flow rates: 1/500/5/500/500 sccm
    Thickness: About 200 Å
  (ii) Second step (Postflowing):
    SiH$_4$/Ar/N$_2$ flow rates: 5/500/500 sccm
    Processing time: 60 s

COMPARATIVE EXAMPLE 9-6

A semiconductor device fabricating method in Comparative example 9-6 was carried out the same as in Example 9-1 to form a WN$_x$ film, except that the WN$_x$ film was formed by using film forming conditions shown below. The coverage (step coverage), adhesion and ability as a barrier of the WN$_x$ film were evaluated. The bottom coverage (step coverage) was 100%. The WN$_x$ film as deposited was substantially equal in adhesion to the WN$_x$ film formed by Example 9-1. As for barrier property some reaction occurred and the WN$_x$ film was partially broken after annealing. The adhesion was reduced by annealing.

(1) Conditions for Semiconductor Device Fabricating System
  (i) Pressure in chamber: 3 torr
  (ii) Surface temperature of wafer: 450° C.
(2) Source Gases
  (1) First step:
    $WF_6/NH_3/SiH_4/Ar/N_2$ flow rates: 80/200/1/100/100 sccm
    Thickness: About 200 Å
  (ii) Second step (Postflowing):
    $SiH_4/Ar/N_2$ flow rates: 1/100/100 sccm
    Processing time: 60 s
    Ar gas and $N_2$ gas were used as carrier gases for the $WF_6$ line and the $NH_3$ line.

COMPARATIVE EXAMPLE 9-7

A semiconductor device fabricating method in Comparative example 9-7 was carried out the same as in Example 9-1 to form a $WN_x$ film, except that the $WN_x$ film was formed by using film forming conditions shown below. The coverage (step coverage), adhesion and ability as a barrier of the $WN_x$ film were evaluated. The bottom coverage (step coverage) was 57%. The $WN_x$ film as deposited was substantially equal in adhesion to the $WN_x$ film formed by Example 9-1. The adhesion and the ability as a barrier of the $WN_x$ film after the heat treatment of the $WN_x$ film could not be evaluated because the heat treatment caused Cu precipitation.
(1) Conditions for Semiconductor Device Fabricating System
  (i) Pressure in chamber: 0.5 torr
  (ii) Surface temperature of wafer: 450° C.
(2) Source Gases
  (i) First step:
    $WF_6/NH_3/SiH_4/Ar/N_2$ flow rates: 1/500/5/500/500 sccm
    Thickness: About 200 Å
  (ii) Second step (Postflowing):
    $SiH_4/Ar/N_2$ flow rates: 5/500/500 sccm
    Processing time: 60 s
    Ar gas and $N_2$ gas were used as carrier gases for the $WF_6$ line and the $NH_3$ line.

It was found from the results of film forming experiments using Examples 9-1 to 9-4 and Comparative examples 9-1 to 9-7 that film forming processes for forming a $WN_x$ film for use as a barrier layer to be interposed between a Cu layer and a layer of another metal, insulator or a semiconductor include the following means in view of forming a $WN_x$ film satisfactory in coverage (step coverage), adhesion and electrical characteristics.
(1) Use of a mixed source gas containing a gas containing Si atoms, such as $SiH_4$ gas, in the film forming process
(2) Exposing the surface of the $WN_x$ film to a mixed gas containing Si atoms, such as $SiH_4$ gas, for postflowing after the film forming process It was also found that desirable film forming conditions for forming the $WN_x$ film include the followings.
(1) The surface temperature is about 300° C. or above, preferably, a temperature in the range of about 350 to 450° C.
(2) The pressure in the film forming chamber is about 0.3 torr or above, preferably, a pressure in the range of abut 1 to 3 torr.

The inventors of the present invention have the following knowledge about the type of a base layer underlying the $WN_x$ film and preferable conditions for the surface treatment of the base layer prior to the formation of the $WN_x$ film. A surface processing mode using a gas containing $WF_6$ gas and not containing $NH_3$ gas for processing the surface of the base layer will be called a surface processing mode A, and another surface processing mode using a gas containing $NH_3$ gas and not containing $WF_6$ gas for processing the surface of the base layer will be called a surface processing mode B.

It was found that both the mode A and the mode B are effective in enhancing the adhesion of the $WN_x$ film with various types of base films including poly-Si, W (tungsten), Cu (copper), $SiO_2$, $Ta_2O_5$ or the like. Forming a polymetal gate of $W/WN_x$/poly-Si construction for the gate electrode of a transistor is a typical application of a $WN_x$ film in combination with a poly-Si base layer. In view of the stability of the electric character of the transistor, the $WN_x$ film included in such a gate electrode must have a very low F (fluorine) content, and hence surface treatment by the surface processing mode B is preferable. However, even when the $WN_x$ film is formed on a poly-Si base layer, if the wafer temperature has to be 500° C. or below in the film forming process, it is desirable to treat the surface of the poly-Si base layer by the surface processing mode A to form a $WN_x$ film that may not peel off in the subsequent thermal process. No problem arises in the adhesion of a $WN_x$ film to a poly-Si base layer when the wafer temperature in the film forming process in high. However, when wafer temperature is low in the film forming process for forming a $WN_x$ film, the $WN_x$ film may peel off in the subsequent thermal process unless a bonding layer is formed in the surface of the semiconductor wafer by the surface processing mode A. When the base layer is a $SiO_2$ film, the surface processing mode D is preferable, because the adhesion of the $WN_x$ film is enhanced and the flatness and smoothness of the $WN_x$ film are improved. When a $WN_x$ film is formed on a $Ta_2O_5$ film serving as a dielectric film for a capacitor, processing mode A is preferable because processing mode A does not include reduction gas such as $NH_3$, so the surface of the $Ta_2O_5$ is not reduced and results in low leakage current.

A semiconductor device fabricating method of the present invention especially about the method for preventing the deposition of reactive by-product and its cleaning using the film forming system shown in FIG. 1 is described hereinafter. This semiconductor device fabricating method is featured by heating a shower head 10 and a film forming vessel defining a film forming chamber 20 by a shower head heater 14 and chamber heaters 21 to the temperatures that will prevent the deposition the by-product from reaction between $WF_6$ gas and $NH_3$ gas such as $NH_4F$, and the compound with W onto the shower head 10 and the film forming vessel. When this semiconductor device fabricating method is used, by-product from reaction between $WF_6$ gas and $NH_3$ gas is prevented to deposit in the film forming chamber 20 and to remain in the film forming chamber 20.

The inventors of the present invention conducted experiments to find a temperature range at which the by-product from $WF_6$ gas and $NH_3$ are produced. In the experiments, $WF_6$ gas and $NH_3$ gas were supplied into the film forming chamber 20 by the same method as in forming a $WN_x$ film, and the temperature of a susceptor 30 was varied from 100° C. up to 400° C. at steps of 50° C. The temperature of a semiconductor wafer W mounted on the susceptor 30 was lower by about 50° C. than that of the susceptor 30. The amount of W contained in a film deposited on the semiconductor wafer W was determined on the basis of the intensity of a spectrum line identifying W obtained by X-ray fluorescence analysis (XRF). Measured results are shown in FIG. 7.

Figure 7:
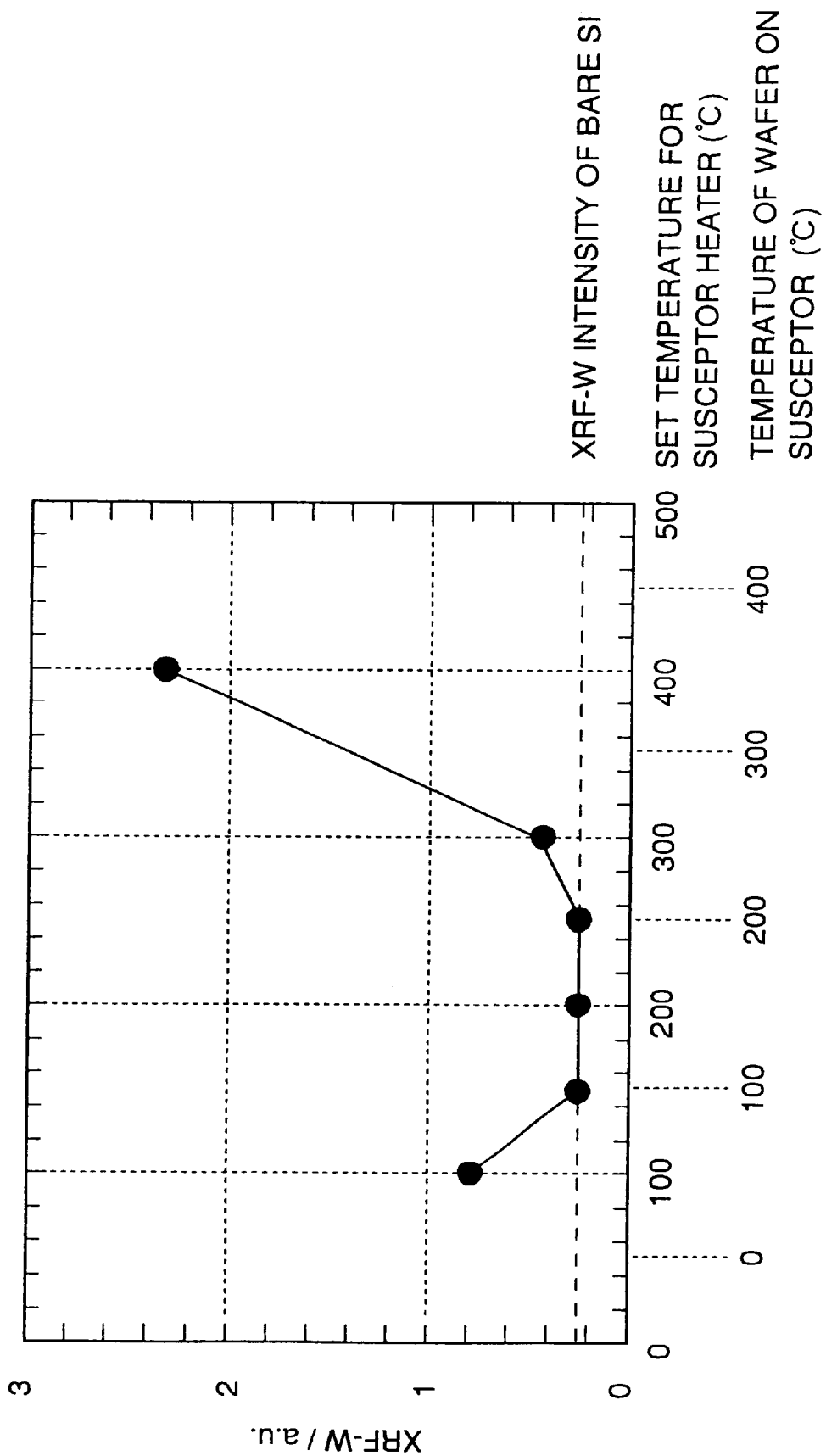
FIG. 7 is a graph showing the relation between the temperature of a susceptor and the amount of deposit on a surface of a semiconductor wafer mounted on the susceptor.

As obvious from FIG. 7, a blue film was deposited when the susceptor 30 was heated at 100° C. and the temperature of the semiconductor wafer was about 50° C. The blue film contained a small amount of W.

When the temperature of the susceptor 30 was in the range of 150 to 250° C., i.e., when the temperature of the semiconductor wafer W was in the range of about 100 to 200° C., no deposition was found by visual observation of the semiconductor wafer W, and the intensity of the spectrum line identifying W by XRF (hereinafter referred to as "XRF-W intensity") was on the same level as that of the semiconductor wafer W when $WF_6$ gas on $NH_3$ gas were not supplied. Thus, it is inferred that substances (by-products) are scarcely deposited on the surface of the semiconductor wafer W when the temperature of the surface of the semiconductor wafer W is in the range of about 100 to 200° C.

When the temperature of the susceptor 30 was raised to a temperature not lower than 300° C., i.e., when the temperature of the semiconductor wafer W is raised to a temperature not lower than 250° C., the XRF-W intensity increased slightly and it could be visually recognized that the surface of the semiconductor wafer W had a golden-and-silvery tinge, from which it is inferred that a very thin $WN_x$ film was formed on the semiconductor wafer W. From inference about deposits deposited in the film forming chamber 20 when $WF_6$ gas and $NH_3$ gas are supplied into the film forming chamber 20, it is possible to provide. A model representing a state in which a compound of $NH_4F$ and W is formed when the surface temperature of the semiconductor wafer W is below 100° C., in which the compound is not deposited on the semiconductor wafer W when the surface temperature of the semiconductor wafer W is not lower than 100° C. and below 250° C., and in which a $WN_x$ film is deposited on the semiconductor wafer W when the surface temperature of the semiconductor wafer W is not lower than 250° C.

The inventors of the present invention examined a cleaning process using $ClF_3$ gas to be carried out after a $WN_x$ film has been formed by using $WF_6$ gas and $NH_3$ gas. It was found that the members disposed in the film forming chamber 20 can be cleaned into a state substantially the same as a state before forming the $WN_x$ film, by maintaining the members disposed in the film forming chamber 20 at temperatures at which the deposition of the by-products can be prevented in the film forming process and by cleaning the same members with $ClF_3$ gas after forming the $WN_x$ film.

Actually, the shower head 10 and the inner surface of the film forming vessel defining the film forming chamber 20 were heated and adjusted at 120° C. for the film forming process, and after the film forming process, the shower head 10 and the inner surface of the film forming vessel defining the film forming chamber 20 were adjusted at 100° C. and were cleaned with $ClF_3$ gas. Subsequently, the film forming chamber 20 was opened and the interior of the film forming vessel was examined visually, and it was found that nothing was remained on the inner surfaces of the film forming vessel and the shower head 10. However, the film forming process was carried out under the condition wherein the inner surfaces of the shower head 10 and the film forming vessel defining the film forming chamber 20 adjusted at a low temperature of, for example, 80° C. and the cleaning using $ClF_3$ gas was carried out. Then, residues were found on the inner surfaces of the shower head 10 and the film forming vessel defining the film forming chamber 20. It is known from these facts that the surfaces can be cleaned into a state substantially the same as a state before forming the film, by maintaining the members other than a susceptor heater at such temperatures that the deposition of the by-products can be prevented in film forming process and by cleaning the surfaces with $ClF_3$ gas after forming the film.

It was found that it is preferable to maintain the members disposed in the film forming chamber 20 at temperatures not lower than about 80° C. and not higher than about 500° C. when the surfaces are cleaned with $ClF_3$ gas. When the members are heated at temperatures higher than about 500° C., the members may be damaged by the cleaning gas. When the members remain at temperatures below about 80° C., it is impossible to achieve an efficient cleaning.

The shower head 10 and the film forming vessel defining the film forming chamber 20 are heated and adjusted by the shower head heater 14 and the chamber heaters 21 at surface temperatures, not lower than 100° C. and below 300° C., preferably, at surface temperatures in the range of 120° C. to 100° C. to prevent the deposition of by-products from the source gases to the surfaces at the time of $WN_x$ film deposition. And they are not lower than 80° C. and below 500° C. at the time of cleaning with $ClF_3$ gas.

Examples of the semiconductor device fabricating method in accordance with the present invention will be described hereinafter.

EXAMPLE 10-1

The same as Example 1.

EXAMPLE 10-2

A semiconductor device fabricating method in Example 10-2 was carried out the same as in Example 1 to form a $W/WN_x$ film by forming a $WN_x$ film and a W film in that order on a 200 Å thick $SiO_2$ film (silicon dioxide film) formed on a semiconductor wafer.

The sheet resistivity of the $WN_x$ film measured by a four-probe method was 2.027 Ω/sq. The resistivity of the $WN_x$ film was 8052 μΩ-cm when the thickness of the $WN_x$ film was 397 Å by converting a measured value measured by an XRF method.

Subsequently, a 1000 Å thick W film was formed on the $WN_x$ film by an ordinary W-CVD process. The $W/WN_x$ film was subjected to a heat resistance test to test the resistance of the $W/WN_x$ film to peeling under the heat. That is, the $W/WN_x$ film formed on the semiconductor wafer was subjected to a rapid thermal annealing process (RTA process), in which the $W/WN_x$ film was heated at 600° C. for 600 s. The adhesion of the $W/WN_x$ film was evaluated after the RTA, and it was found that there were no problem in the adhesion of the $W/WN_x/SiO_2$ film.

After a predetermined number of semiconductor wafers were processed by the film forming process specified by the foregoing process conditions, the film forming chamber 20 was cleaned by in situ cleaning using cleaning conditions shown below. After the completion of the cleaning process, heating of the film forming vessel, the susceptor and the shower head was stopped and the film forming vessel, the susceptor and the shower head were left to cool to an ordinary temperature. The film forming vessel was opened and the interior of the film forming vessel was examined visually. The surfaces of the film forming vessel, the susceptor and the shower head were as clean as they were before the film forming process; that is, the interior of the film forming vessel could be satisfactorily cleaned by the cleaning process.

Conditions for Cleaning Process
(1) Pressure in film forming chamber: 1 torr
(2) $ClF_3$/AR gas flow rates: 200/50 sccm
(3) Cleaning time: 180 s

COMPARATIVE EXAMPLE 10-1

A semiconductor device fabricating method in Comparative example 10-1 was carried out the same as in Example 10-1 to form a $WN_x$ film and a W film on a semiconductor wafer, except that the shower head 10 and the inner surface of the film forming vessel defining the film forming chamber 20 were heated at 60° C. and 80° C., respectively. In this case, deposition rate was excessively low. The same cleaning process as in Example 10-1 was carried out, the film forming vessel was left to cool after the cleaning process, and the interior of the film forming vessel was observed visually. Brown deposition, which was not found when Example 10-1 was carried out, was found on the shower head 10 and the inner surface of the film forming vessel defining the film forming vessel 20. It was inferred that a by-product, i.e., a compound produced from $NH_4F$ and W, remained on the shower head 10 and the inner surface of the film forming vessel due to the insufficient heating of the shower head 10 and the film forming vessel in the preparatory process and the film forming process, absorbed the source gases expected to reach the semiconductor wafer during the film forming process and reduced deposition rate, and the cleaning process could not remove the deposits completely.

COMPARATIVE EXAMPLE 10-2

A semiconductor device fabricating method in Comparative example 10-2 was carried out the same as in Example 10-1 for the preparatory process and the film forming process, and the susceptor was adjusted at 500° C. in the cleaning process subsequent to the film forming process. The film forming vessel was opened after being cooled and the interior was observed visually. Metal components around the shower head and the susceptor were corroded.

COMPARATIVE EXAMPLE 10-3

A semiconductor device fabricating method in Comparative example 10-3 carried out the same as in Example 10-1 for the preparatory process and the film forming process, and the shower head and the inner surface of the film forming vessel were adjusted at 50° C. in the cleaning process subsequent to the film forming process. The film forming vessel was opened after being cooled and the interior was observed visually. The pre-coat film formed by the preparatory process remained. It was inferred that the shower head and the film forming vessel could not satisfactorily cleaned by the cleaning process for the same cleaning time as in Example 10-1 because of insufficient heating of the shower head and the film cleaning vessel.

The present invention is not limited in its practical application to the foregoing examples. It is to be understood that the present invention includes semiconductor device fabricating methods that heat portions of a gas supply mechanism and/or portions of a film forming vessel exposed to gases to temperature capable of preventing the deposition of a by-product produced from tungsten hexafluoride gas and ammonia gas on those portions, and semiconductor device fabricating methods that heat portions of a gas supply mechanism and/or portions of a film forming vessels exposed to gases to predetermined temperatures and supplies chlorine trifluoride gas into the film forming chamber after the completion of a film forming process using tungsten hexafluoride gas and ammonia gas.

What is claimed is:

1. A semiconductor device fabricating method comprising:
    a preparatory process that brings a first source gas containing tungsten atoms into contact with a workpiece and not bringing a second source gas containing nitrogen atoms into contact with the workpiece, wherein the preparatory process comprises the steps of:
        adjusting process pressure at which the workpiece is processed to a value in the range of 0.1 to 20 torr;
        heating the workpiece at a temperature in the range of 300 to 500° C.; and
        adjusting flow rate of the first source gas to a value in the range of 0.5 to 10 sccm or adjusting partial pressure of the first source gas to a pressure in the range of $5 \times 10^{-4}$ to 10 torr; and
    a film forming process that forms a tungsten nitride film on the workpiece by using the first source gas and the second source gas so as to fabricate a semiconductor device.

2. A semiconductor device fabricating method according to claim 1, wherein the film forming process comprises the steps of:
    adjusting process pressure at which the workpiece is processed to a value in the range of 0.1 to 50 torr;
    heating the workpiece at a temperature in the range of 300 to 650° C.;
    adjusting flow rate of the first source gas to a value in the range of 0.5 to 100 sccm or adjusting partial pressure of the first source gas to a pressure in the range of $5 \times 10^{-4}$ to 50 torr; and
    adjusting flow rate of the second source gas to a value in the range of 20 to 1000 sccm.

3. A semiconductor device fabricating method according to claim 1, wherein the first source gas is tungsten hexafluoride gas and the second source gas is ammonia gas.

4. A semiconductor device fabricating method according to claim 3, wherein the film forming process comprises the steps of:
    adjusting process pressure at which the workpiece is processed to a value in the range of 0.1 to 50 torr;
    heating the workpiece at a temperature in the range of 300 to 650° C.; and
    adjusting flow rate of the first source gas to a value in the range of 0.5 to 100 sccm or adjusting partial pressure of the first source gas to a pressure in the range of $5 \times 10^{-4}$ to 50 torr; and
    adjusting flow rate of the second source gas to a value in the range of 20 to 1000 sccm.

* * * * *